(12) United States Patent
Li et al.

(10) Patent No.: US 12,020,632 B2
(45) Date of Patent: *Jun. 25, 2024

(54) DISPLAY PANEL AND DISPLAY DEVICE

(71) Applicant: Xiamen Tianma Micro-Electronics Co., Ltd., Xiamen (CN)

(72) Inventors: Jieliang Li, Xiamen (CN); Ping An, Xiamen (CN)

(73) Assignee: Xiamen Tlanma Mic ro-Electronics Co., Ltd., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/187,711

(22) Filed: Mar. 22, 2023

(65) Prior Publication Data
US 2023/0222966 A1 Jul. 13, 2023

Related U.S. Application Data

(63) Continuation of application No. 17/472,725, filed on Sep. 13, 2021, now Pat. No. 11,670,221.

(30) Foreign Application Priority Data

Apr. 28, 2021 (CN) ......................... 202110470529.X

(51) Int. Cl.
*G09G 3/32* (2016.01)
*G09G 3/3233* (2016.01)
(Continued)

(52) U.S. Cl.
CPC ............. *G09G 3/32* (2013.01); *G09G 3/3233* (2013.01); *G09G 3/3291* (2013.01);
(Continued)

(58) Field of Classification Search
CPC ...... G09G 3/32–3291; G09G 2300/0421–043; G09G 2300/0809;
(Continued)

(56) References Cited

U.S. PATENT DOCUMENTS

2020/0226978 A1 7/2020 Lin et al.
2021/0027696 A1 1/2021 Kim et al.
(Continued)

FOREIGN PATENT DOCUMENTS

| CN | 111883055 A | 11/2020 |
|---|---|---|
| CN | 112331134 A | 2/2021 |
| CN | 112634832 A | 4/2021 |

*Primary Examiner* — Nathan Danielsen
(74) *Attorney, Agent, or Firm* — KILPATRICK TOWNSEND & STOCKTON LLP

(57) ABSTRACT

A display panel includes a pixel circuit and a light-emitting element. The pixel circuit includes a data write device, a drive device and a bias adjustment device. The display panel further includes a bias adjustment signal line, a reset signal line or an initialization signal line. At least one side frame of the display panel includes a bias adjustment signal bus, a reset signal bus or an initialization signal bus. The bias adjustment signal bus is disposed in a first side frame of the display panel, the reset signal bus or the initialization signal bus is disposed in a second side frame of the display panel; and the first side frame is adjacent to the second side frame, or is opposite to the second side frame, or, the bias adjustment signal bus is disposed in a same side frame with the reset signal bus or the initialization signal bus.

20 Claims, 26 Drawing Sheets

(51) Int. Cl.
*G09G 3/3291* (2016.01)
*H01L 27/12* (2006.01)
(52) U.S. Cl.
CPC ... *H01L 27/124* (2013.01); *G09G 2300/0819* (2013.01); *G09G 2310/0216* (2013.01); *G09G 2310/0251* (2013.01); *G09G 2310/061* (2013.01); *G09G 2310/08* (2013.01); *G09G 2320/0233* (2013.01); *G09G 2320/045* (2013.01)
(58) Field of Classification Search
CPC ... G09G 2300/0819; G09G 2300/0842; G09G 2300/0852; G09G 2300/0861; G09G 2300/0866; G09G 2310/0264; G09G 2310/027; G09G 2310/0272; G09G 2310/0278; G09G 2310/0289; G09G 2310/06–062; G09G 2310/067; G09G 2310/08; G09G 2320/0233; G09G 2320/029; G09G 2320/0295; G09G 2320/043; G09G 2320/045
See application file for complete search history.

(56) References Cited

U.S. PATENT DOCUMENTS

2021/0350740 A1\* 11/2021 Byun ................. G09G 3/32
2021/0391407 A1\* 12/2021 Yoon ................. G06F 3/0412

\* cited by examiner

DISPLAY PANEL AND DISPLAY DEVICE

CROSS-REFERENCE TO RELATED APPLICATION(S)

This is a continuation application of U.S. patent application Ser. No. 17/472,725, filed on Sep. 13, 2021, which claims priority to Chinese Patent Application No. 202110470529.X filed Apr. 28, 2021, the disclosures of which are incorporated herein by reference in their entirety.

FIELD

Embodiments of the present disclosure relate to the field of display technologies and, in particular, to a display panel and a display device.

BACKGROUND

In a display panel, a pixel circuit provides a drive current required for displaying to a light-emitting element of the display panel and controls whether the light-emitting element enters a light emission stage. The pixel circuit is an indispensable element in most self-luminous display panels.

However, in the existing display panels, an internal characteristic of a drive transistor therein change slowly as the service time increases, which causes a threshold voltage of the drive transistor to drift, affecting an overall characteristic of the drive transistor and further affecting the display uniformity.

SUMMARY

Embodiments of the present disclosure provide a display panel and a display device to ameliorate the problem of threshold voltage drift of an existing drive transistor.

Embodiments of the present disclosure provide a display panel including a pixel circuit and a light-emitting element.

The pixel circuit includes a data write device, a drive device and a bias adjustment device; the pixel circuit further includes at least one of a reset device or an initialization device.

The display panel further includes: a bias adjustment signal line, the bias adjustment signal line is connected to the bias adjustment device and configured to provide a bias adjustment signal; at least one of a reset signal line or an initialization signal line, the reset signal line is connected to the reset device and configured to provide a reset signal, or the initialization signal line is connected to the initialization device and configured to provide an initialization signal.

At least one side frame of the display panel includes: a bias adjustment signal bus, the bias adjustment signal line is connected to the bias adjustment signal bus; at least one of a reset signal bus or an initialization signal bus, the reset signal line is connected to the reset signal bus, or the initialization signal line is connected to the initialization signal buss.

The bias adjustment signal bus is disposed in a first side frame of the display panel, the reset signal bus or the initialization signal bus is disposed in a second side frame of the display panel, and the first side frame is adjacent to the second side frame, or is opposite to the second side frame; or, the bias adjustment signal bus is disposed in a same side frame with the reset signal bus or the initialization signal bus.

Embodiments of the present disclosure further provide a display device. The display device includes a display panel including a pixel circuit and a light-emitting element.

The pixel circuit includes a data write device, a drive device and a bias adjustment device; the pixel circuit further includes at least one of a reset device or an initialization device.

The display panel further includes: a bias adjustment signal line, the bias adjustment signal line is connected to the bias adjustment device and configured to provide a bias adjustment signal; at least one of a reset signal line or an initialization signal line, the reset signal line is connected to the reset device and configured to provide a reset signal, or the initialization signal line is connected to the initialization device and configured to provide an initialization signal.

At least one side frame of the display panel includes: a bias adjustment signal bus, the bias adjustment signal line is connected to the bias adjustment signal bus; at least one of a reset signal bus or an initialization signal bus, the reset signal line is connected to the reset signal bus, or the initialization signal line is connected to the initialization signal buss.

The bias adjustment signal bus is disposed in a first side frame of the display panel, the reset signal bus or the initialization signal bus is disposed in a second side frame of the display panel, and the first side frame is adjacent to the second side frame, or is opposite to the second side frame; or, the bias adjustment signal bus is disposed in a same side frame with the reset signal bus or the initialization signal bus.

BRIEF DESCRIPTION OF DRAWINGS

In order that the embodiments of the present disclosure are described more clearly, drawings to be used in the description of the embodiments are briefly described hereinafter. Apparently, while the drawings in the description are some embodiments of the present disclosure may be expanded and extended to other structures and drawings according to the basic concepts of the device structure, driving method, and manufacturing method disclosed and indicated in embodiments of the present disclosure. These are all within the scope of the claims of the present disclosure.

DETAILED DESCRIPTION

In order that the embodiments of the present disclosure are described more clearly hereinafter with reference to drawings of embodiments of the present disclosure and in conjunction with implementations. Apparently, the embodiments described herein are some embodiments, not all embodiments, of the present disclosure.

Figure 1:
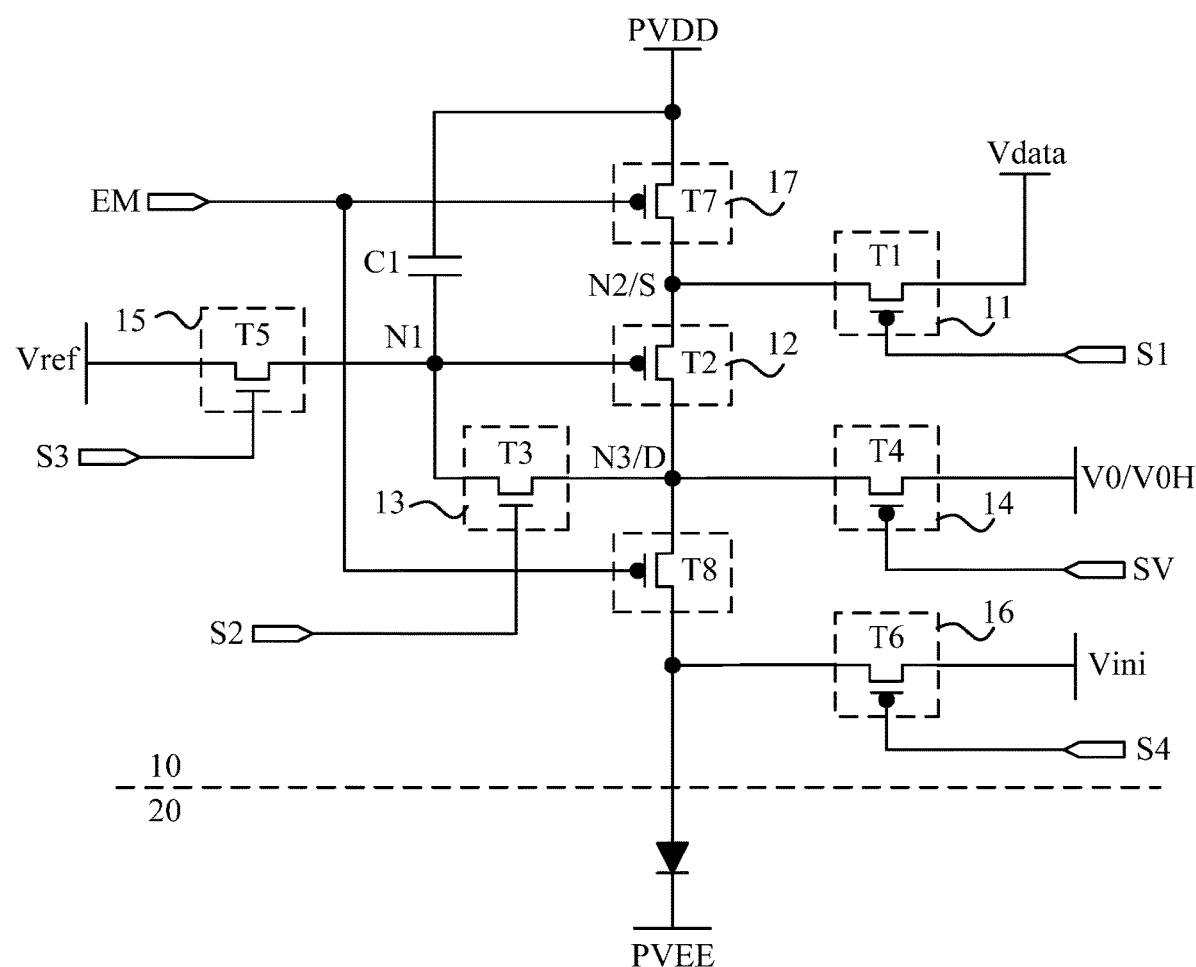
FIG. 1 is a structure diagram of a pixel circuit of a display panel according to an embodiment of the present disclosure.
Figure 2:
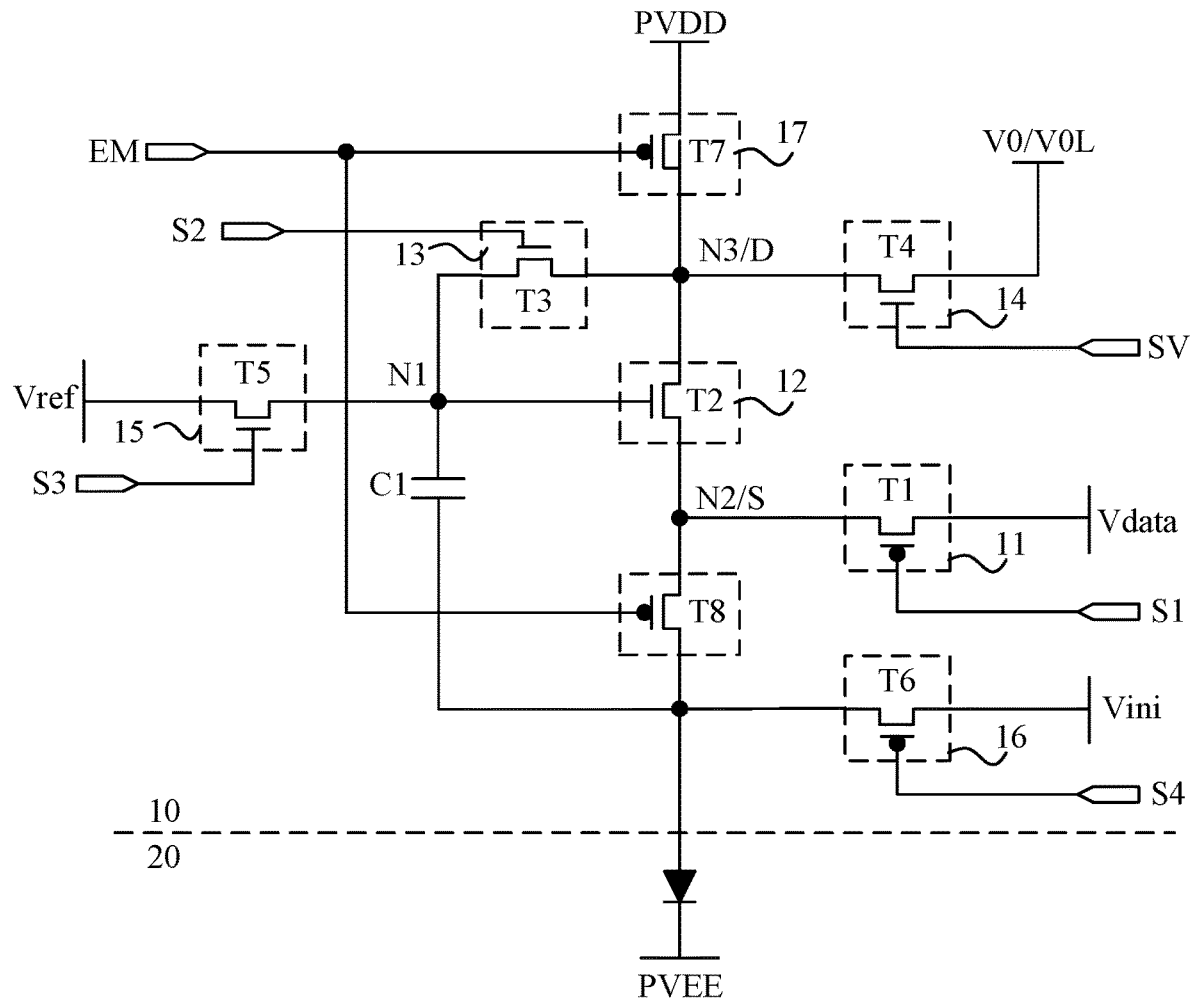
FIG. 2 is a structure diagram of a pixel circuit of the display panel according to another embodiment of the present disclosure.
Figure 29:
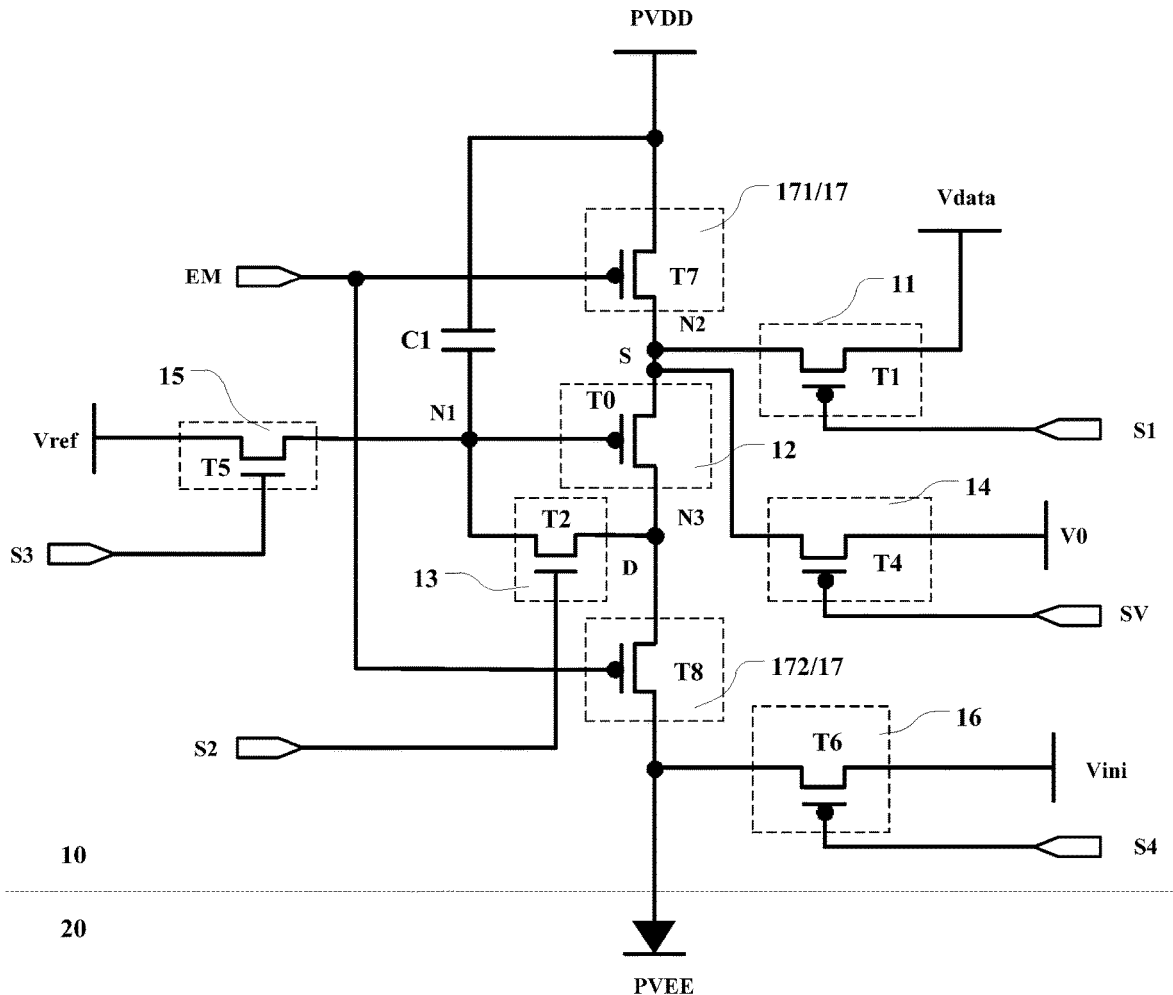
FIG. 29 is a structure diagram of a pixel circuit of the display panel according to another embodiment of the present disclosure.
Figure 30:
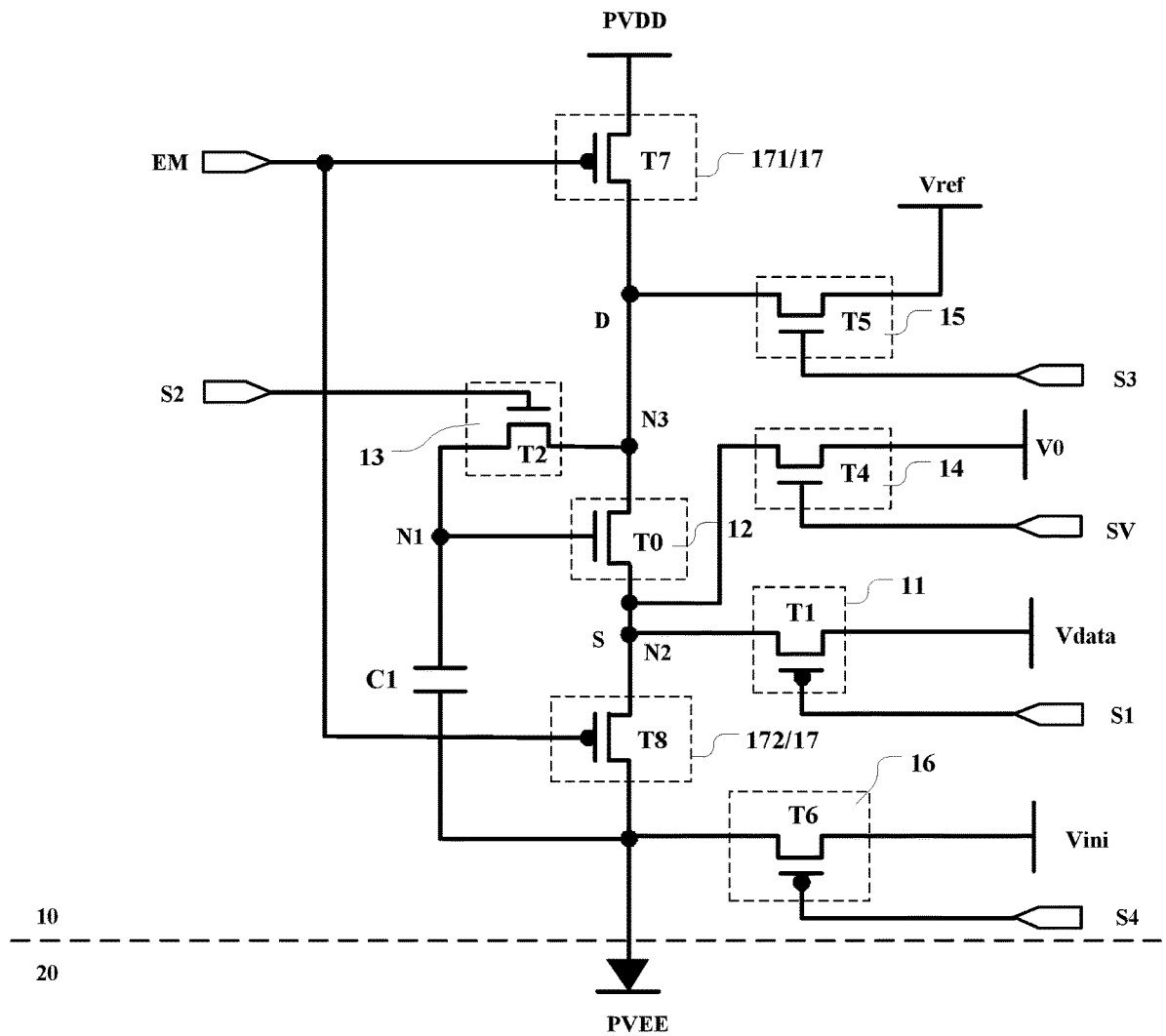
FIG. 30 is a structure diagram of a pixel circuit of the display panel according to another embodiment of the present disclosure.

As shown in FIG. 1, FIG. 1 is a structure diagram of a pixel circuit of a display panel according to an embodiment of the present disclosure. FIG. 2 is a structure diagram of a pixel circuit of the display panel according to another embodiment of the present disclosure. FIG. 29 is a structure diagram of a pixel circuit of the display panel according to another embodiment of the present disclosure. FIG. 30 is a structure diagram of a pixel circuit of the display panel according to another embodiment of the present disclosure. The display panel provided in this embodiment includes a pixel circuit 10 and a light-emitting element 20. The pixel circuit 10 includes a data write device 11, a drive device 12, and a compensation device 13. The drive device 12 is configured to provide a drive current for the light-emitting element 20, and the drive device 12 includes a drive transistor T2. The data write device 11 is configured to provide a data signal Vdata for the drive device 12, and the data write device 11 is connected to a source S of the drive transistor T2. The compensation device 13 is configured to compensate for a threshold voltage of the drive transistor T2. The pixel circuit 10 further includes a bias adjustment device 14, and the bias adjustment device 14 is connected between the source S or a drain D of the drive transistor T2 and a bias adjustment signal terminal. The working process of the pixel circuit 10 includes a bias adjustment stage. In the bias adjustment stage, the bias adjustment device 14 is turned on and a bias adjustment signal V0 is provided to the source S or the drain D of the drive transistor T2. As shown in FIG. 1, in an embodiment, the drive transistor T2 is a PMOS transistor, and the bias adjustment signal V0 is a high-level signal V0H, the bias adjustment device 14 is connected between a drain D of the drive transistor T2 and a bias adjustment signal terminal. As shown in FIG. 29, in an embodiment, the drive transistor T0 is a PMOS transistor, and the bias adjustment signal V0 is a high-level signal V0H, the bias adjustment device 14 is connected between a source S of the drive transistor T0 and a bias adjustment signal terminal. In an embodiment, as shown in FIG. 2, the drive transistor T2 is an NMOS transistor, and the bias adjustment signal V0 is a low-level signal V0L, the bias adjustment device 14 is connected between a drain D of the drive transistor T2 and a bias adjustment signal terminal. In an embodiment, as shown in FIG. 30, the drive transistor T0 is an NMOS transistor, and the bias adjustment signal V0 is a low-level signal V0L, the bias adjustment device 14 is connected between a source S of the drive transistor T0 and a bias adjustment signal terminal.

It is to be noted that FIGS. 1-2 and 29-30 illustrate only the key structures of the preceding embodiment and does not include all the structures operating in the circuit. The complete circuit structure is gradually shown in the following description of this embodiment. In the following embodiments, only the case where the bias adjustment device is connected between a drain of the drive transistor and a bias adjustment signal terminal is used as an example for description, and the design with the case where the bias adjustment device is connected between a source of the drive transistor and a bias adjustment signal terminal may refer to the design with the case where the bias adjustment device is connected between a drain of the drive transistor and a bias adjustment signal terminal, which will not be repeated herein.

In this embodiment, the pixel circuit 10 includes the data write device 11. An input terminal of the data write device 11 is configured to receive the data signal Vdata. A control terminal of the data write device 11 is configured to receive a scan signal S1. An output terminal of the data write device 11 is electrically connected to the source S of the drive device 12. It is to be understood that the source S of the drive device 12 is a second node N2. The scan signal S1 received by the pixel circuit 10 is a pulse signal, and an effective pulse of the scan signal S1 controls a transmission path between the input terminal of the data write device 11 and the output terminal of the data write device 11 to be connected, and the data signal Vdata is provided to the source S of the drive device 12. An invalid pulse of the scan signal S1 controls the transmission path between the input terminal of the data write device 11 and the output terminal of the data write device 11 to be disconnected. Therefore, under the control of the scan signal S1, the data write device 11 provides the data signal Vdata to the source of the drive device 12 or not.

The pixel circuit 10 includes the drive device 12. A second end of the drive device 12 is coupled to the light-emitting element 20. The drive device 12 includes the drive transistor T2. After the drive transistor T2 is turned on, the drive device 12 provides the drive current for the light-emitting element 20. As shown in FIG. 1, in a case where the drive transistor T2 is PMOS, a source of the drive transistor T2 is electrically connected to a first end of the drive device 12, and a drain of the drive transistor T2 is electrically connected to a second end of the drive device 12. As shown in FIG. 2, in a case where the drive transistor T2 is NMOS, the source of the drive transistor T2 is electrically connected to the second end of the drive device 12, and the drain of the drive transistor T2 is electrically connected to the first end of the drive device 12. In this embodiment, the data write device 11 is connected to the source S of the drive transistor T2. It is to be understood that a source and a drain of a same transistor are not fixed or cannot be changed, but can be changed as a drive state of the transistor changes.

The pixel circuit 10 includes the compensation device 13, and the compensation device 13 is configured to compensate for a threshold voltage of the drive transistor T2. A first pole of the compensation device 13 is electrically connected to a first node N1 (that is, a control terminal of the drive device 12). A control terminal of the compensation device 13 is configured to receive a scan signal S2. A second pole of the compensation device 13 is electrically connected to a third node N3 (that is, a drain D of the drive device 12). The scan signal S2 received by the pixel circuit 10 is a pulse signal, and an effective pulse of the scan signal S2 controls a transmission path between the first pole of the compensation device 13 and the second pole of the compensation device 13 to be connected and a voltage between the control terminal of the drive device 12 and the drain D of the drive device 12 is adjusted, and the threshold voltage of the drive transistor T2 is compensated. An invalid pulse of the scan signal S2 controls the transmission path between the first pole of the compensation device 13 and the second pole of the compensation device 13 to be disconnected. Therefore, under the control of the scan signal S2, the compensation device 13 compensates for a threshold voltage of the drive device 12 or not.

The pixel circuit 10 includes the bias adjustment device 14. The bias adjustment device 14 is connected between the drain D of the drive transistor T2 and the bias adjustment signal terminal. The bias adjustment signal terminal provides a bias adjustment signal V0. The bias adjustment device 14 is configured to provide the bias adjustment signal V0 to the drain D of the drive transistor T2 in the bias adjustment stage. An output terminal of the bias adjustment device 14 is electrically connected to the drain D of the drive device 12. A control terminal of the bias adjustment device 14 is configured to receive a scan signal SV. An input terminal of the bias adjustment device 14 is connected to the bias adjustment signal terminal. The scan signal SV received by the pixel circuit 10 is a pulse signal, and an effective pulse of the scan signal SV controls a transmission path between the input terminal and the output terminal of the bias adjustment device 14 to be connected and the bias adjustment signal V0 is provided to the drain D of the drive device 12. An invalid pulse of the scan signal SV controls the transmission path between the input terminal of the bias adjustment device 14 and the output terminal of the bias adjustment device 14 to be disconnected. Therefore, under the control of the scan signal SV, the bias adjustment device 14 provides the bias adjustment signal V0 for the drain D of the drive device 12 or not.

A working process of the pixel circuit 10 includes a bias adjustment stage. In the bias adjustment stage, the scan signal SV is an effective pulse and the bias adjustment device 14 is turned on, and the bias adjustment signal V0 is provided to the drain of the drive transistor T2. In a non-bias adjustment stage, the scan signal SV is an invalid pulse and the bias adjustment device 14 is turned off.

In a non-bias adjustment stage of the pixel circuit 10 such as a light emission stage, the drive transistor T2 is in an ON state. As shown in FIG. 1, in a case where the drive transistor T2 is PMOS, the drive transistor T2 is in an ON state, that is, in a state where the potential of the gate of the drive transistor T2 is lower than the source potential of the drive transistor T2. However, in this case, the drive transistor T2 is working in an unsaturated state, and the voltage of the drain of the drive transistor T2 is often lower than the voltage of the gate of the drive transistor T2 and the PMOS transistor is turned on while the voltage of the drain of the drive transistor is lower than the voltage of the gate thereof. In one embodiment, a voltage difference and a potential difference between the voltage of the drain and the voltage of the gate are often relatively great. As shown in FIG. 2, in a case where the drive transistor T2 is NMOS, the drive transistor T2 is in an ON state, that is, in a state where the potential of the gate of the drive transistor T2 is greater than the source potential of the drive transistor T2, and the voltage of the drain of the drive transistor T2 is a PVDD signal and the NMOS transistor is turned on while the voltage of the drain of the drive transistor is greater than the voltage of the gate thereof. In one embodiment, the voltage difference and the potential difference between the voltage of the drain and the voltage of the gate are often relatively great. Such a setting for long-term would cause the ions inside the drive transistor to be polarized, and further to form a built-in electric field inside the drive transistor, resulting in a continuous increase of the threshold voltage of the drive transistor.

Figure 3:
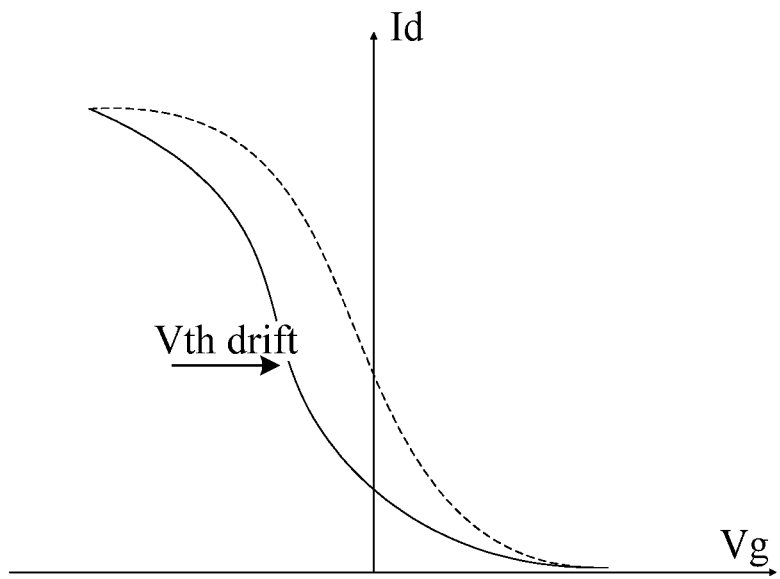
FIG. 3 is a schematic diagram of a drift of an Id-Vg curve of a drive transistor.

FIG. 3 is a schematic diagram of a drift of an Id-Vg curve of a drive transistor. As shown in FIG. 3, the Id-Vg curve drifts, which affects the drive current flowing into the light-emitting element, and affecting the display uniformity. In this embodiment, the bias adjustment stage is added to the working process of the pixel circuit 10. In the bias adjustment stage, the bias adjustment device 14 is turned on, and the bias adjustment signal V0 provided by the bias adjustment signal terminal is written into the drain D of the drive transistor T2 through the turned-on bias adjustment device 14 and the potential difference between the drain and the gate is adjusted.

As shown in FIG. 1, the drive transistor T2 is PMOS, and the bias adjustment signal V0 is a high-level signal V0H. In the bias adjustment stage, the compensation device 13 is turned off, and the drain D of the drive transistor T2 is configured to receive the high-level signal V0H. In this case, compared to the non-bias adjustment stage, the potential of the drain of the drive transistor T2 is increased to an extent in the bias adjustment stage and the potential of the gate, the potential of the source S, and the potential of the drain D of the drive transistor T2 in the bias adjustment stage are adjusted. In an embodiment, the potential of the drain V0H of the drive transistor T2 is higher than the potential of the gate of the drive transistor T2, that is, the potential of the third node N3 is higher than the potential of the first node N1 and the reverse bias of the drive transistor T2 is achieved, and weakening the degree of ion polarization inside the drive transistor T2 and reducing the threshold voltage of the drive transistor T2. The threshold voltage of the drive transistor T2 is adjusted by biasing the drive transistor T2 and the potential difference between the potential of the gate of the drive transistor and the potential of the drain of the drive transistor T2 is ameliorated.

As shown in FIG. 2, the drive transistor T2 is NMOS, and the bias adjustment signal V0 is a low-level signal V0L. In the bias adjustment stage, the compensation device 13 is turned off, and the drain D of the drive transistor T2 is configured to receive the low-level signal V0L. In an embodiment, the voltage of the low-level signal V0L is lower than the voltage of PVDD. In this case, compared to the non-bias stage, the potential of the drain of the drive transistor T2 is decreased to an extent in the bias adjustment stage and the potential of the gate, the potential of the source S, and the potential of the drain D of the drive transistor T2 in the bias adjustment stage are adjusted. In an embodiment, the potential of the drain V0L of the drive transistor T2 is lower than the potential of the gate of the drive transistor T2, that is, the potential of the third node N3 is lower than the potential of the first node N1 and the reverse bias of the drive transistor T2 is achieved, and weakening the degree of ion polarization inside the drive transistor T2 and reducing the threshold voltage of the drive transistor T2. The threshold voltage of the drive transistor T2 is adjusted by biasing the drive transistor T2 and the potential difference between the potential of the gate of the drive transistor and the potential of the drain of the drive transistor T2 is ameliorated.

Based on above, in the bias adjustment stage, the potential difference between the potential of the gate of the drive transistor and the potential of the drain of the drive transistor T2 may be adjusted. In such arrangement, the internal characteristic of the drive transistor T2 are affected and the influence of the potential difference between the potential of the gate of the drive transistor and the potential of the drain of the drive transistor T2 in the non-bias stage on the internal characteristic of the drive transistor T2 may be balanced. Apparently, the decrease in the threshold voltage of the drive transistor T2 in the bias adjustment stage may balance the increase in the threshold voltage of the drive transistor T2 in the non-bias stage. In such arrangement, it is ensured that the Id-Vg curve does not drift, and thus the display uniformity of the display panel is ensured.

In an embodiment, the data write device 11 includes a first transistor T1, an input terminal of the first transistor T1 is configured to receive the data signal Vdata, an output terminal of the first transistor T1 is connected to the source of the drive transistor T2, and a gate of the first transistor T1 is configured to receive the scan signal S1. In an embodiment, the compensation device 13 includes a third transistor T3, a first pole of the third transistor T3 is connected to the gate (equivalent to the first node N1) of the drive transistor T2, a second pole of the third transistor T3 is connected to the drain D (equivalent to the third node N3) of the drive transistor T2, and a gate of the third transistor T3 is configured to receive the scan signal S2. In an embodiment, the bias adjustment device 14 includes a fourth transistor T4, an input terminal of the fourth transistor T4 is connected to the bias adjustment signal terminal, an output terminal of the fourth transistor T4 is connected to the drain D of the drive transistor T2, and a gate of the fourth transistor T4 is configured to receive the scan signal SV.

According to the different types of the preceding transistors, materials for preparing the transistors may be reasonably selected. For example, as shown in FIG. 1, in an embodiment, the first transistor T1, the drive transistor T2, and the fourth transistor T4 are all PMOS and low-temperature polysilicon semiconductor transistors; the third transistor T3 is NMOS and is an oxide semiconductor transistor, which may be an indium gallium zinc oxide (IGZO) semiconductor transistor in an embodiment. For example, as shown in FIG. 2, in an embodiment, the first transistor T1 is PMOS and a low-temperature polysilicon semiconductor transistor, while the drive transistor T2, the third transistor T3, and the fourth transistor T4 are all NMOS and oxide semiconductor transistors, which may be indium gallium zinc oxide (IGZO) semiconductor transistors in an embodiment, and is conducive to stabilizing the potential of the drive transistor. The oxide semiconductor transistor has the advantages of high mobility, good uniformity, transparency, and simple manufacturing process. Compared with the silicon-based semiconductor transistor, the oxide semiconductor transistor has better threshold voltage uniformity, less leakage, and relatively low hysteresis and is suitable for the manufacturing of large-size display products. However, it is to be understood that the models of the first transistor, the second transistor, the third transistor and the fourth transistor are not limited to the examples shown in FIGS. 1 and 2. The relevant practitioners can reasonably select the models thereof according to product requirements. For example, the first transistor is NMOS, and the fourth transistor is NMOS. It is to be understood that for a PMOS transistor, the effective pulse received by the gate of the PMOS transistor is a low-level signal, and the invalid pulse received by the gate of the PMOS transistor is a high-level signal. For an NMOS transistor, the effective pulse received by the gate of the NMOS transistor is a high-level signal, and the invalid pulse received by the gate of the NMOS transistor is a low-level signal.

In embodiments of the present disclosure, the working process of the pixel circuit includes the bias adjustment stage. In the bias adjustment stage, the bias adjustment device is turned on, and the bias adjustment signal at the bias adjustment signal terminal is written into the drain of the drive transistor through the turned-on bias adjustment device and a potential of the drain of the drive transistor is adjusted, and the potential difference between a potential of the gate of the drive transistor and the potential of the drain of the drive transistor is ameliorated. It is known that the pixel circuit includes at least one non-bias stage. In a case where the drive current is generated in the drive transistor, the drive transistor being at the non-bias state for long-term may cause the I-V curve of the drive transistor to drift, and cause the threshold voltage of the drive transistor to drift. In the bias adjustment stage, the potential of the gate of the drive transistor and the potential of the drain of the drive transistor are adjusted and the drift of the I-V curve of the drive transistor in the non-bias stage can be balanced, and ameliorating the phenomenon of threshold voltage drift of the drive transistor and ensuring the display uniformity of the display panel.

By way of example, referring to FIGS. 1 and 2, in an embodiment, the pixel circuit 10 further includes a reset device 15. One end of the reset device 15 is connected to a reset signal terminal and is configured to receive a reset signal Vref, and the other end of the reset device 15 is connected to the gate of the drive transistor T2. In a reset stage, the reset device 15 is turned on and the reset signal Vref is provided to the gate of the drive transistor T2. In this embodiment, in the reset stage, the reset device 15 directly provides the reset signal Vref to the gate of the drive transistor T2.

A control terminal of the reset device 15 is configured to receive a scan signal S3. The scan signal S3 received by the pixel circuit 10 is a pulse signal, and an effective pulse of the scan signal S3 controls a transmission path between an input terminal and an output terminal of the reset device 15 to be turned on and the reset signal Vref is written into the gate of the drive device T2. An invalid pulse of the scan signal S3 controls the transmission path between the input terminal and the output terminal of the reset device 15 to be disconnected. Therefore, under the control of the scan signal S3, the reset device 15 writes the reset signal Vref into the gate of the drive device 12 or not.

In an embodiment, the reset device 15 includes a fifth transistor T5, an input terminal of the fifth transistor T5 is connected to the reset signal terminal, an output terminal of the fifth transistor T5 is connected to the gate (equivalent to the first node N1) of the drive transistor T2, and the gate of the fifth transistor T5 is configured to receive the scan signal S3. In an embodiment, the fifth transistor T5 is NMOS and an oxide semiconductor transistor, which may be an indium gallium zinc oxide (IGZO) semiconductor transistor in an embodiment. In other embodiments, the fifth transistor may also be PMOS and a silicon-based semiconductor transistor, which may be a low-temperature polysilicon (LTPS) semiconductor transistor, which is not limited herein.

The working process of the pixel circuit 10 further includes a reset stage. In the reset stage, the effective pulse of the scan signal S3 controls the reset device 15 to be turned on, and then the reset signal Vref provided by the reset signal terminal is written into the gate of the drive transistor T2 through the turned-on reset device 15 and the gate of the drive transistor T2 is reset. For a PMOS drive transistor T2, the reset signal Vref is usually a negative voltage signal such as −7 V and the voltage of the gate of the drive transistor T2 remains negative in the reset stage, which facilitates the subsequent bias adjustment and data writing. For an NMOS drive transistor T2, the reset signal Vref is usually a positive voltage signal such as +6 V and the voltage of the gate of the drive transistor T2 remains positive in the reset stage, which facilitates the subsequent bias adjustment and data writing.

Figure 4:
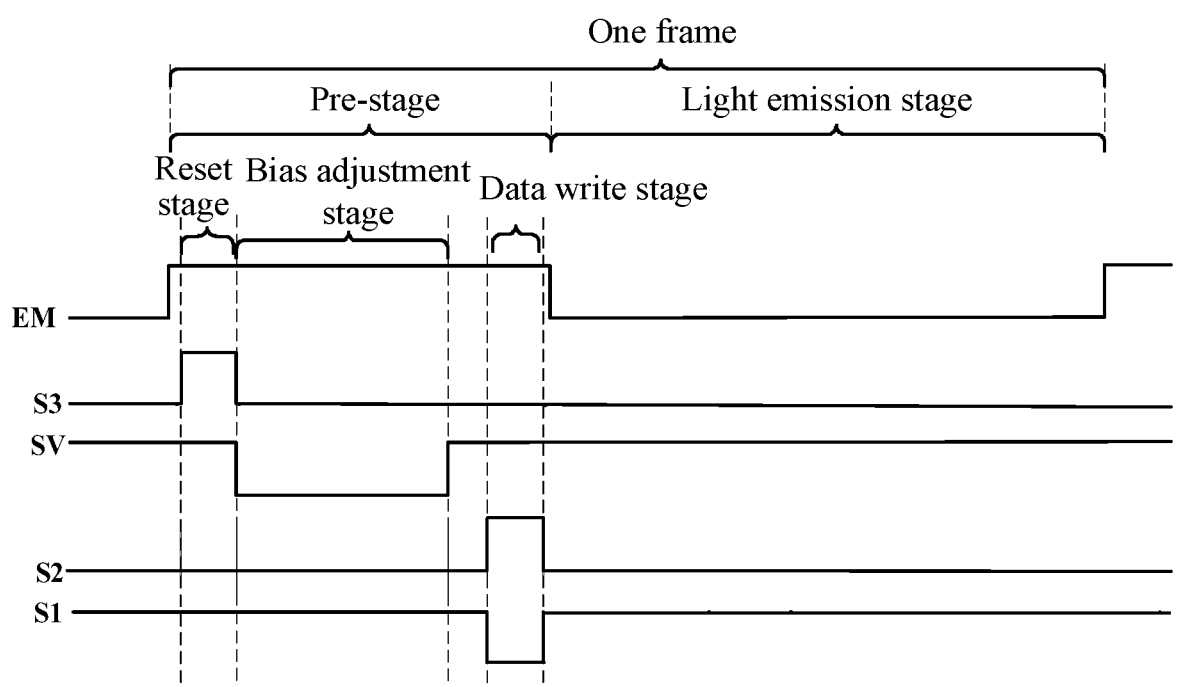
FIG. 4 is a timing diagram of the pixel circuit of FIG. 1.

The pixel circuit shown in FIG. 1 is used as an example. FIG. 4 is a timing diagram of the pixel circuit of FIG. 1. In conjunction with FIGS. 1 and 4, in the reset stage, the effective pulse of the scan signal S3 controls the reset device 15 to be turned on, and the reset signal Vref with a negative voltage is written into the gate of the drive transistor T2 through the turned-on reset device 15; in the bias adjustment stage, the bias adjustment device 14 is turned on and the compensation device 13 is turned off, and the high-level bias adjustment signal V0H is written into the drain of the drive transistor T2 through the turned-on bias adjustment device 14, where the compensation device 13 remains to be turned off. In this case, the voltage of the gate of the drive transistor T2 is lower than the voltage of the drain of the drive transistor T2 and the voltage of the gate of the drive transistor T2 and the voltage of the drain of the drive transistor T2 are biased.

In an embodiment, in the bias adjustment stage, the compensation device 13 is turned off, and during at least part of the time period of the bias adjustment stage, the reset device 15 is turned on and the pixel circuit 10 performs the reset stage at a same time. During at least part or all of the time period of the bias adjustment stage, the reset stage is performed. On the one hand, the potential of the drain of the drive transistor T2 is adjusted by using the bias adjustment signal V0; and on the other hand, the potential of the gate of the drive transistor T2 is adjusted by using the reset signal Vref and the voltage of the gate of the drive transistor T2 and the voltage of the drain of the drive transistor T2 can be adjusted at a same time, which is conducive to improving the bias effect, and further conductive to reducing a duration of a pre-stage of one frame of picture, and increasing a refresh frequency.

Figure 5:
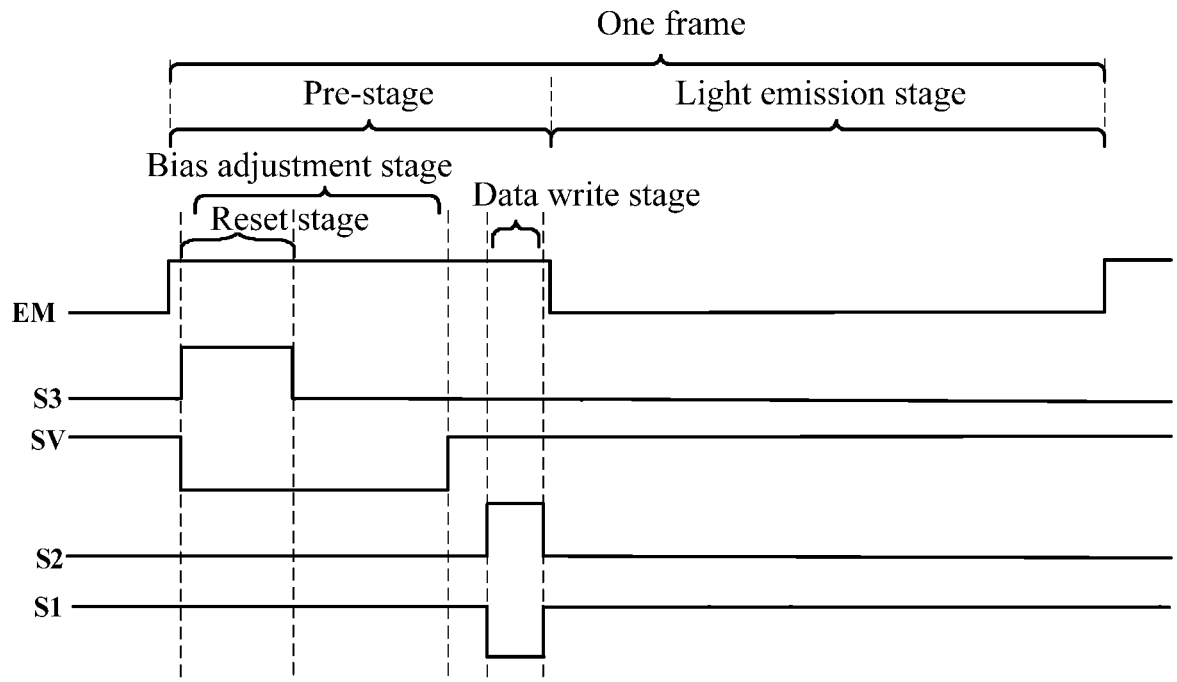
FIG. 5 is another timing diagram of the pixel circuit of FIG. 1.

The pixel circuit shown in FIG. 1 is used as an example. FIG. 5 is another timing diagram of the pixel circuit of FIG. 1. In conjunction with FIGS. 1 and 5, in the repetition period of the reset stage and the bias adjustment stage, the reset device 15 and the bias adjustment device 14 are turned on at a same time, and the compensation device 13 is turned off and the reset signal Vref is written into the gate of the drive transistor T2 through the turned-on reset device 15, and at the same time, the bias adjustment signal V0H is written into the drain of the drive transistor T2 through the turned-on bias adjustment device 14. Both the voltage of the gate and the voltage of the drain of the drive transistor T2 are biased.

Figure 6:
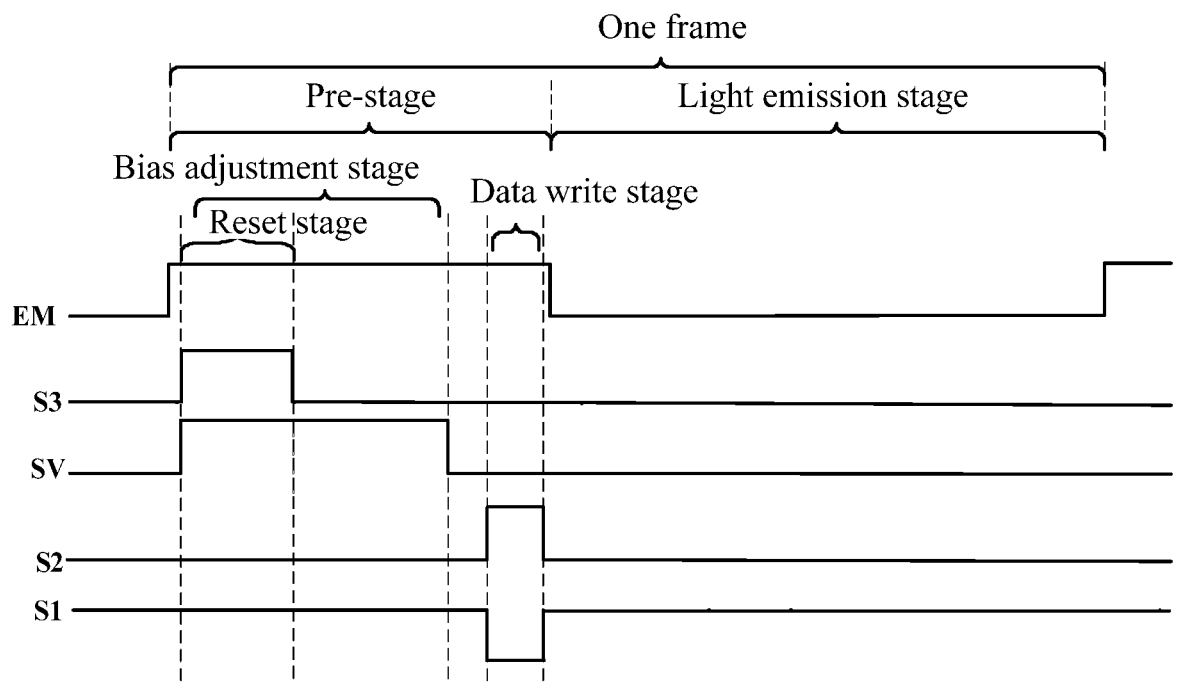
FIG. 6 is a timing diagram of the pixel circuit of FIG. 2.

The pixel circuit shown in FIG. 2 is used as an example. FIG. 6 is a timing diagram of the pixel circuit of FIG. 2. In conjunction with FIGS. 2 and 6, in the repetition period of the reset stage and the bias adjustment stage, the effective pulse of the scan signal S3 controls the reset device 15 to be turned on, and the reset signal Vref with a positive voltage is written into the gate of the drive transistor T2 through the turned-on reset device 15; at the same time, the effective pulse of the scan signal SV controls the bias adjustment device 14 to be turned on, the compensation device 13 is turned off, and a low-level bias adjustment signal V0L is written into the drain of the drive transistor T2 through the turned-on bias adjustment device 14. In this case, the voltage of the gate of the drive transistor T2 is higher than the voltage of the drain of the drive transistor T2 and both the voltage of the gate and the voltage of the drain of the drive transistor T2 are biased. In other embodiments, the time period of the reset stage and the time period of the bias adjustment stage do not overlap.

Figure 7:
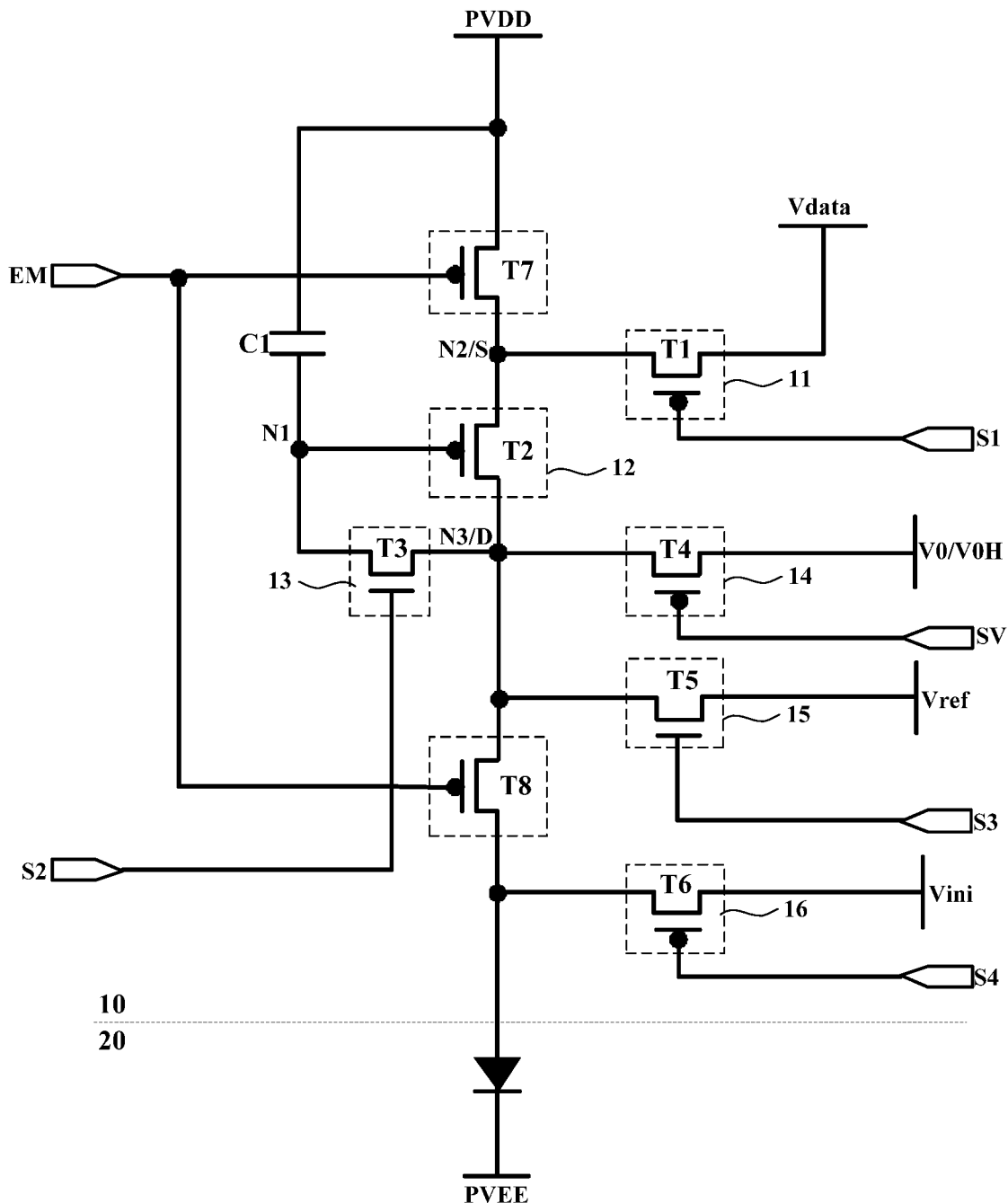
FIG. 7 is a structure diagram of a pixel circuit of the display panel according to another embodiment of the present disclosure.
Figure 8:
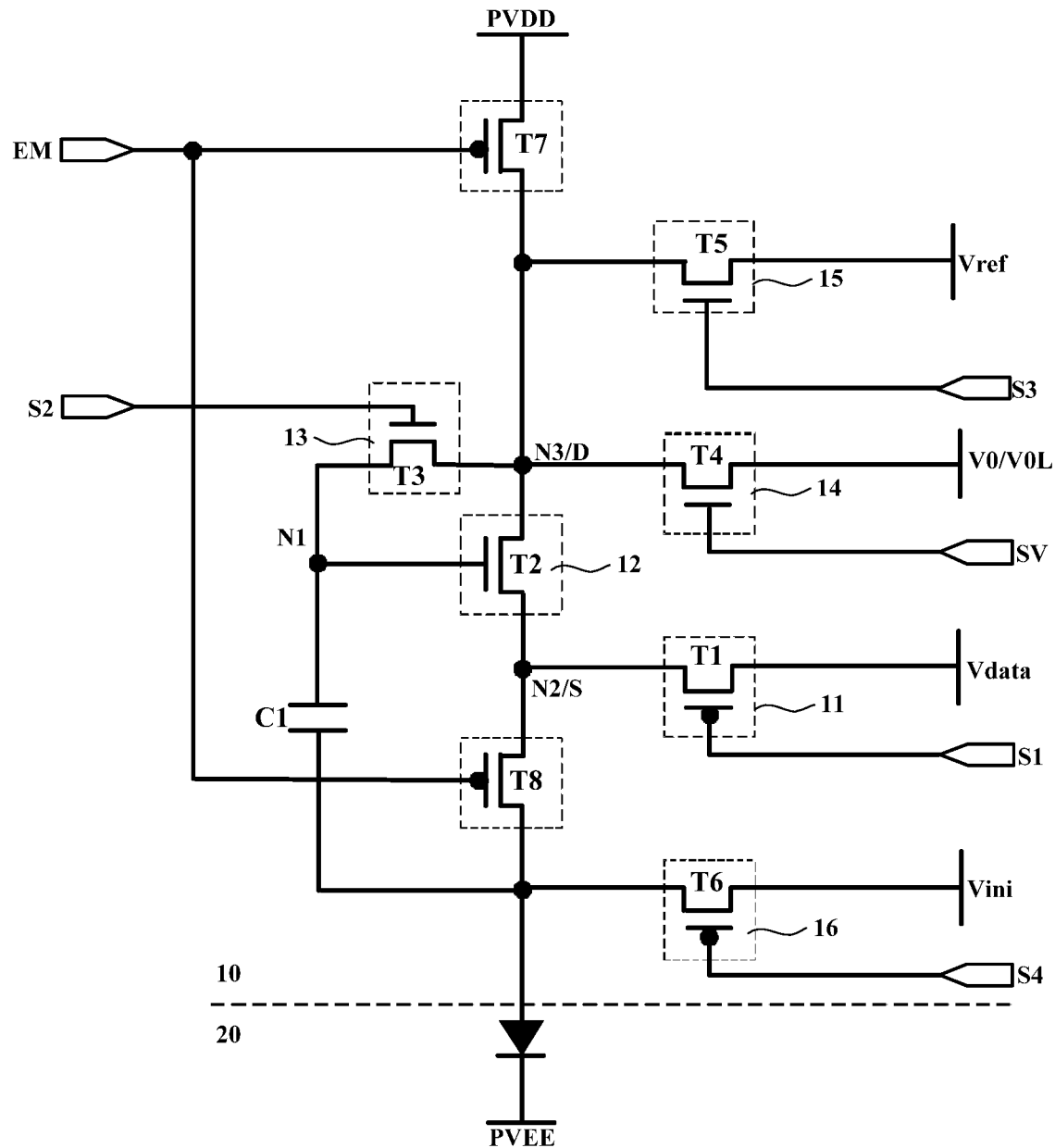
FIG. 8 is a structure diagram of a pixel circuit of the display panel according to another embodiment of the present disclosure.

By way of example, as shown in FIG. 7, FIG. 7 is a structure diagram of a pixel circuit of the display panel according to another embodiment of the present disclosure. As shown in FIG. 8, FIG. 8 is a structure diagram of a pixel circuit of the display panel according to another embodiment of the present disclosure. Referring to FIGS. 7 and 8, the pixel circuit 10 further includes the reset device 15. One end of the reset device 15 is connected to the reset signal terminal and is configured to receive the reset signal Vref, and the other end of the reset device 15 is connected to the drain D of the drive transistor T2. In the reset stage, the reset device 15 and the compensation device 13 are turned on and the reset signal Vref is provided to the gate of the drive transistor T2. As shown in FIG. 7, the drive transistor T2 is PMOS; as shown in FIG. 8, the drive transistor T2 is NMOS. The difference between FIG. 7 and FIG. 1 (or between FIG. 8 and FIG. 2) is that one end of the reset device 15 is connected to the drain D of the drive transistor T2 instead of the gate of the drive transistor T2. In this embodiment, in the reset stage, the reset signal Vref is provided to the gate of the drive transistor T2, via the reset device 15 and the compensation device 13 sequentially.

The control terminal of the reset device 15 is configured to receive the scan signal S3. In an embodiment, the reset device 15 includes the fifth transistor T5, the output terminal of the fifth transistor T5 is connected to the drain D (equivalent to the third node N3) of the drive transistor T2, and in an embodiment, the fifth transistor T5 is NMOS.

The working process of the pixel circuit 10 further includes the reset stage. In the reset stage, the reset signal Vref provided by the reset signal terminal needs to be written into the gate of the drive transistor T2. In this embodiment, the output terminal of the reset device 15 is connected to the drain D of the drive transistor T2, and the compensation device 13 is connected between the drain D of the drive transistor T2 and the gate of the drive transistor T2. In the reset stage, the reset device 15 and the compensation device 13 should be turned on. The output terminal of the reset device 15 and the output terminal of the bias adjustment device 14 are both connected to the drain of the drive transistor T2, so the time period of the reset stage and the time period of the bias adjustment stage do not overlap.

In the reset stage, the effective pulse of the scan signal S3 controls the reset device 15 to be turned on, and the effective pulse of the scan signal S2 controls the compensation device 13 to be turned on and the reset signal Vref provided by the reset signal terminal is written into the drain D of the drive transistor T2 through the turned-on reset device 15 and written from the drain D of the drive transistor T2 into the gate of the drive transistor T2 through the turned-on compensation device 13. In such arrangement, the gate of the drive transistor T2 is reset.

Figure 9:
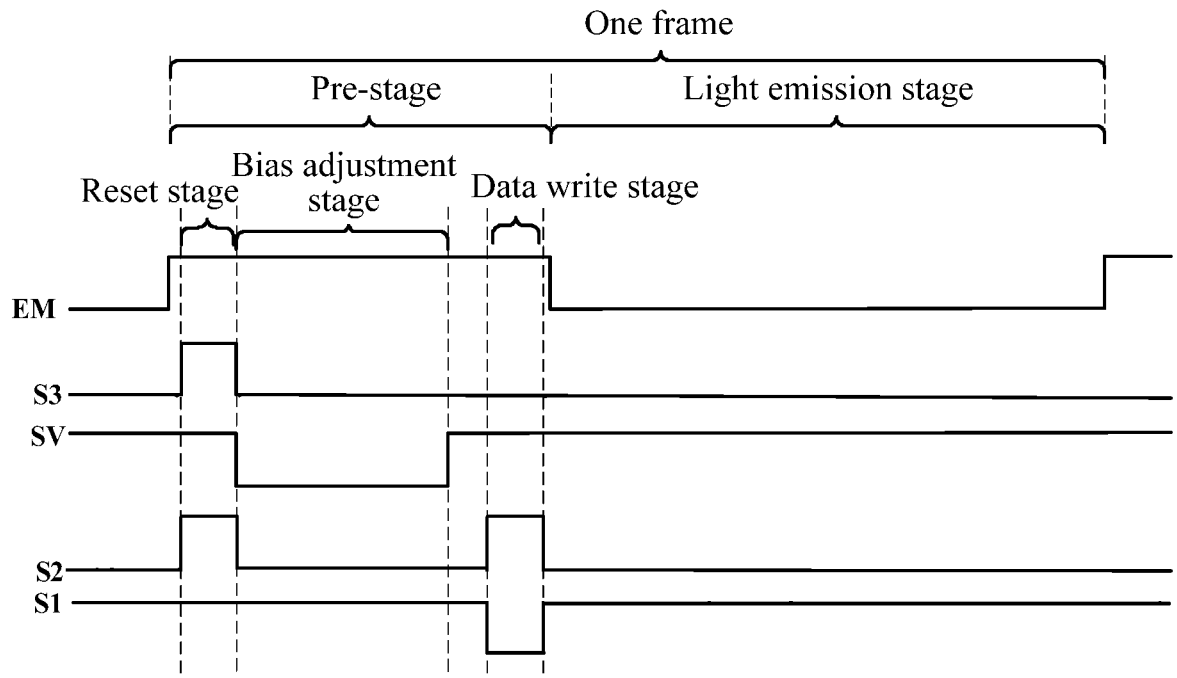
FIG. 9 is a timing diagram of the pixel circuit of FIG. 7.

The pixel circuit shown in FIG. 7 is used as an example. FIG. 9 is a timing diagram of the pixel circuit of FIG. 7. In conjunction with FIGS. 7 and 9, in the reset stage, the effective pulses of the scan signals S3 and S2 respectively control the reset device 15 and the compensation device 13 to be turned on, and the reset signal Vref with a negative voltage is written into the gate of the drive transistor T2; in the bias adjustment stage, the bias adjustment device 14 is turned on, the compensation device 13 and the reset device 15 are turned off, and the high-level bias adjustment signal V0H is written into the drain of the drive transistor T2. In this case, the voltage of the gate of the drive transistor T2 is lower than the voltage of the drain of the drive transistor T2 and both the voltage of the gate and the voltage of the drain of the drive transistor T2 are biased.

Figure 10:
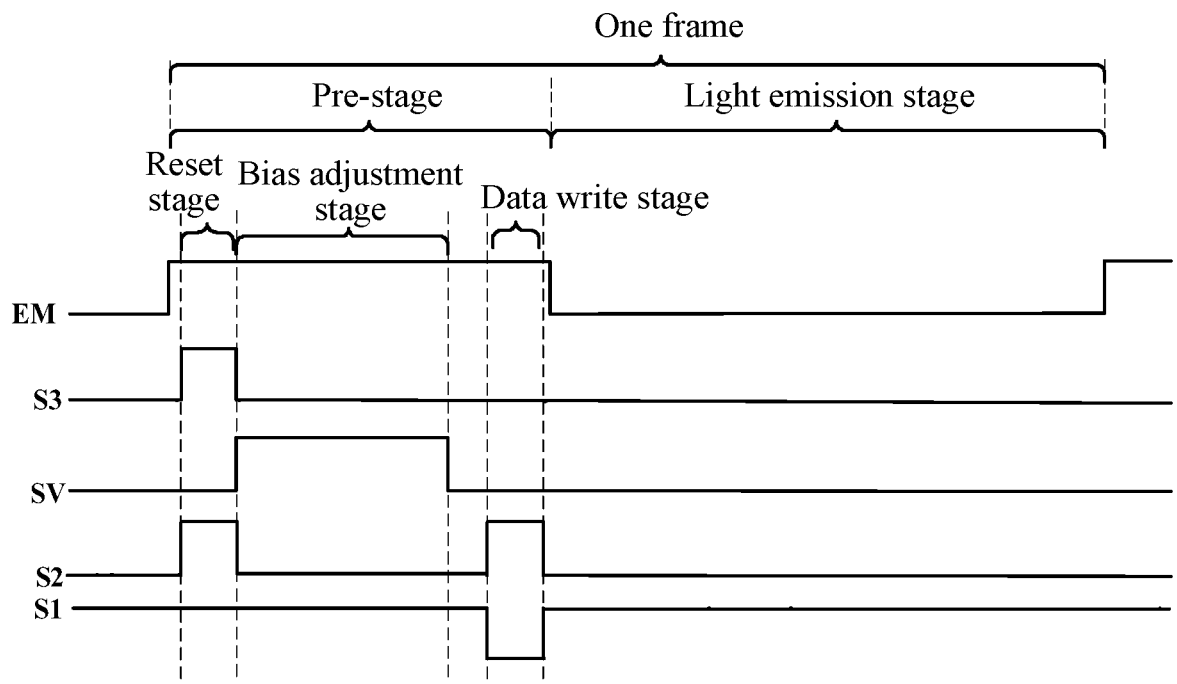
FIG. 10 is a timing diagram of the pixel circuit of FIG. 8.

The pixel circuit shown in FIG. 8 is used as an example. FIG. 10 is a timing diagram of the pixel circuit of FIG. 8. In conjunction with FIGS. 8 and 10, in the reset stage, the effective pulses of the scan signals S3 and S2 respectively control the reset device 15 and the compensation device 13 to be turned on, and the reset signal Vref with a positive voltage is written into the gate of the drive transistor T2. In the bias adjustment stage, the effective pulse of the scan signal SV controls the bias adjustment device 14 to turned on, the compensation device 13 and the reset device 15 are turned off, and the low-level bias adjustment signal V0L is written into the drain of the drive transistor T2. In this case, the voltage of the gate of the drive transistor T2 is higher than the voltage of the drain of the drive transistor T2 and the both the voltage of the gate and the voltage of the drain of the drive transistor T2 are biased.

Figure 11:
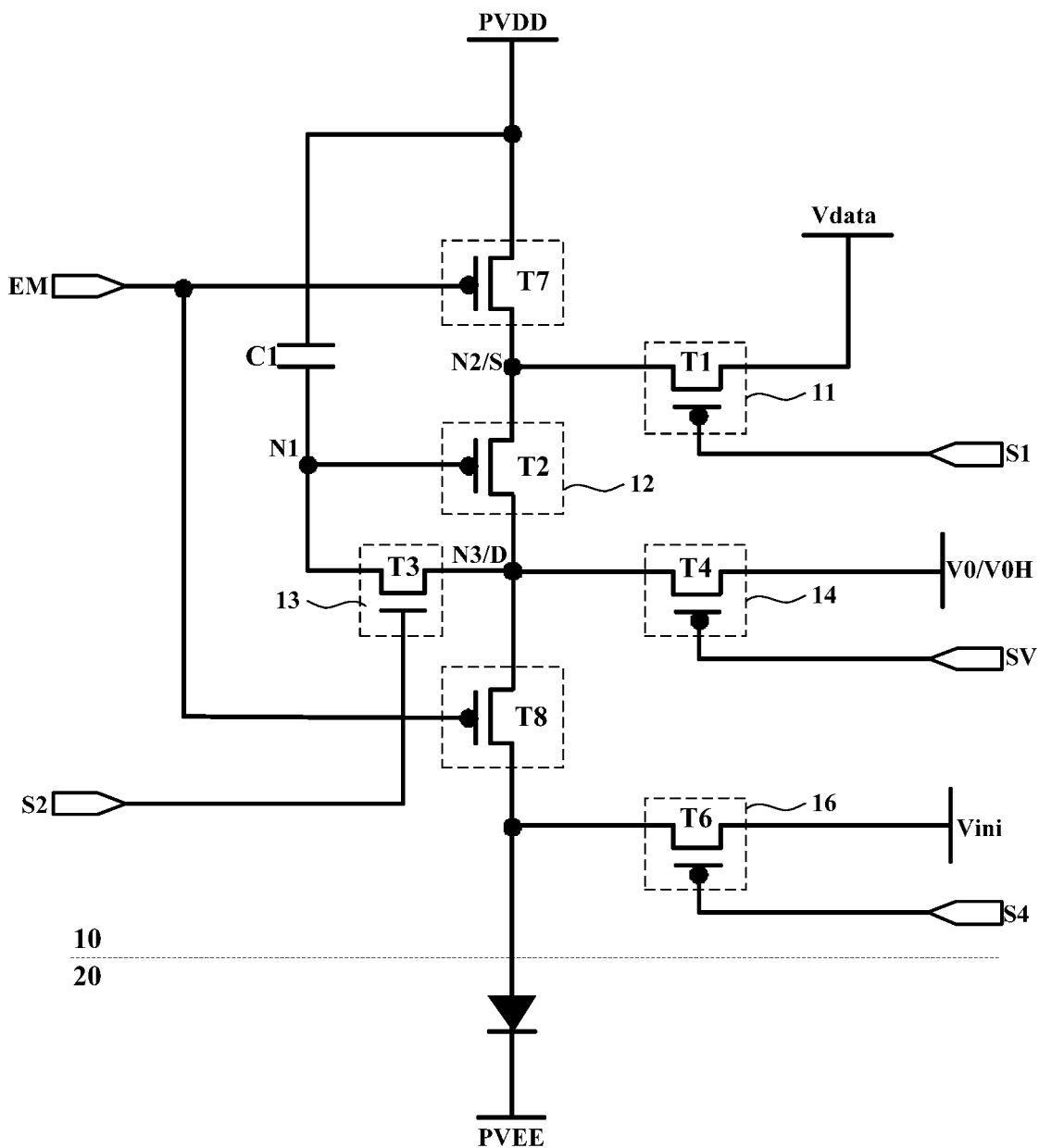
FIG. 11 is a structure diagram of a pixel circuit of the display panel according to another embodiment of the present disclosure.

By way of example, referring to FIG. 11, FIG. 11 is a structure diagram of a pixel circuit of the display panel according to another embodiment of the present disclosure. As shown in FIG. 11, in an embodiment, the pixel circuit 10 further includes an initialization device 16. One end of the initialization device 16 is connected to an initialization signal terminal and is configured to receive an initialization signal Vini, and the other end of the initialization device 16 is connected to the light-emitting element 20. In an initialization stage, the initialization device 16 is turned on and the initialization signal Vini is provided to the light-emitting element 20. It is to be understood that FIG. 11 is only an example of one of the pixel circuits, and this figure only illustrates the connection between the initialization device 16 and the light-emitting element 20.

A control terminal of the initialization device 16 is configured to receive a scan signal S4, an input terminal of the initialization device 16 is configured to receive the initialization signal Vini, and an output terminal of the initialization device 16 is electrically connected to an anode of the light-emitting element 20. The scan signal S4 received by the pixel circuit 10 is a pulse signal, and an effective pulse of the scan signal S4 controls a transmission path between the input terminal and the output terminal of the initialization device 16 to be turned on and the initialization signal Vini is written into the light-emitting element 20 for initialization. An invalid pulse of the scan signal S4 controls the transmission path between the input terminal and the output terminal of the initialization device 16 to be turned off. Therefore, under the control of the scan signal S4, the initialization device 16 initializes the light-emitting element 20 or not. The initialization signal Vini is usually a negative voltage signal. In the initialization stage, the initialization signal Vini is written into the anode of the light-emitting element 20 and an initial voltage of the anode of the light-emitting element 20 remains negative.

In an embodiment, the initialization device 16 includes a sixth transistor T6, a gate of the sixth transistor T6 is configured to receive the scan signal S4, an input terminal of the sixth transistor T6 is connected to the initialization signal terminal, and an output terminal of the sixth transistor T6 is connected to the anode of the light-emitting element 20. In an embodiment, the sixth transistor T6 is PMOS, which may be a low-temperature polysilicon semiconductor transistor. In other embodiments, the sixth transistor may also be NMOS and an oxide semiconductor transistor, which may be an indium gallium zinc oxide (IGZO) semiconductor transistor in an embodiment, and is not limited herein.

The working process of the pixel circuit 10 further includes the initialization stage. In the initialization stage, the scan signal S4 outputs an effective pulse to control the initialization device 16 to be turned on and the initialization signal Vini is written into the anode of the light-emitting element 20, and thus the initialization of the light-emitting element 20 can be achieved.

Figure 12:
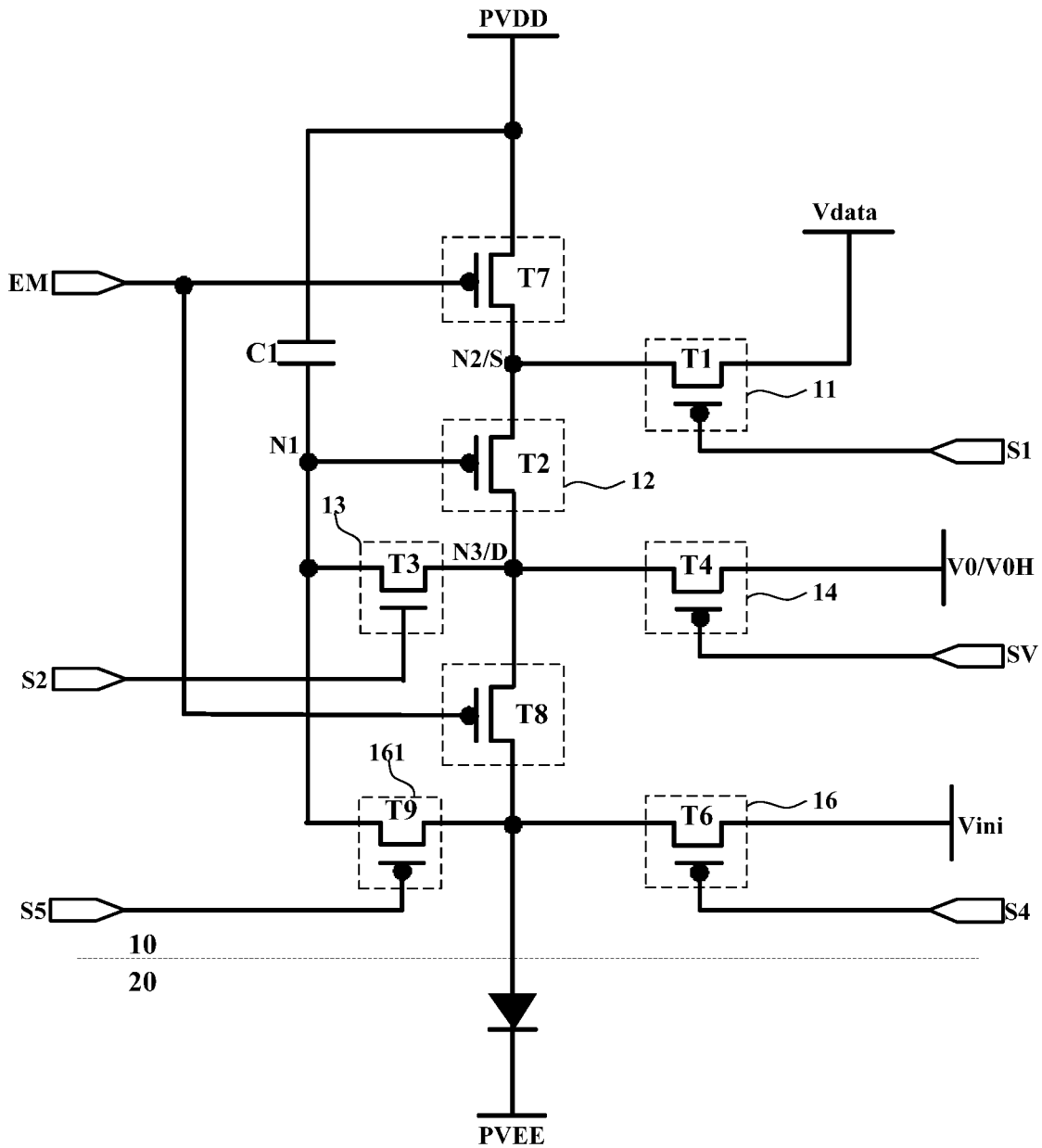
FIG. 12 is a structure diagram of a pixel circuit of the display panel according to another embodiment of the present disclosure.

Referring to FIG. 12, FIG. 12 is a structure diagram of a pixel circuit of the display panel according to another embodiment of the present disclosure. As shown in FIG. 12, in an embodiment, the drive transistor T2 is a PMOS transistor, and the pixel circuit 10 further includes a switching device 161. One end of the switching device 161 is connected to the light-emitting element 20, and the other end of the switching device 161 is connected to the gate of the drive transistor T2. During at least part of the time period of the initialization stage, the initialization device 16 is turned on, the switching device 161 is turned on, the initialization signal Vini also serves as a reset signal, and the reset signal is provided to the gate of the drive transistor T2. It is to be understood that FIG. 12 is only an example of one of the pixel circuits, and this figure only illustrates the connection of the switching device 161 in the pixel circuit.

In this embodiment, a control terminal of the switching device 161 is configured to receive a scan signal S5, a first terminal of the switching device 161 is connected to the anode of the light-emitting element 20, and a second terminal of the switching device 161 is connected to the gate of the drive transistor T2, that is, the second terminal of the switching device 161 is connected to the first node N1. The scan signal S5 received by the pixel circuit 10 is a pulse signal, and an effective pulse of the scan signal S5 controls a transmission path between the first terminal and the second terminal of the switching device 161 to be turned on. An invalid pulse of the scan signal S5 controls the transmission path between the first terminal and the second terminal of the switching device 161 to be turned off.

The working process of the pixel circuit 10 further includes the initialization stage. In this embodiment, at least part of the time period of the initialization stage also serves as the reset stage. In an embodiment, the gate of the drive transistor T2 is reset through the initialization device 16 and the switching device 161.

Figure 13:
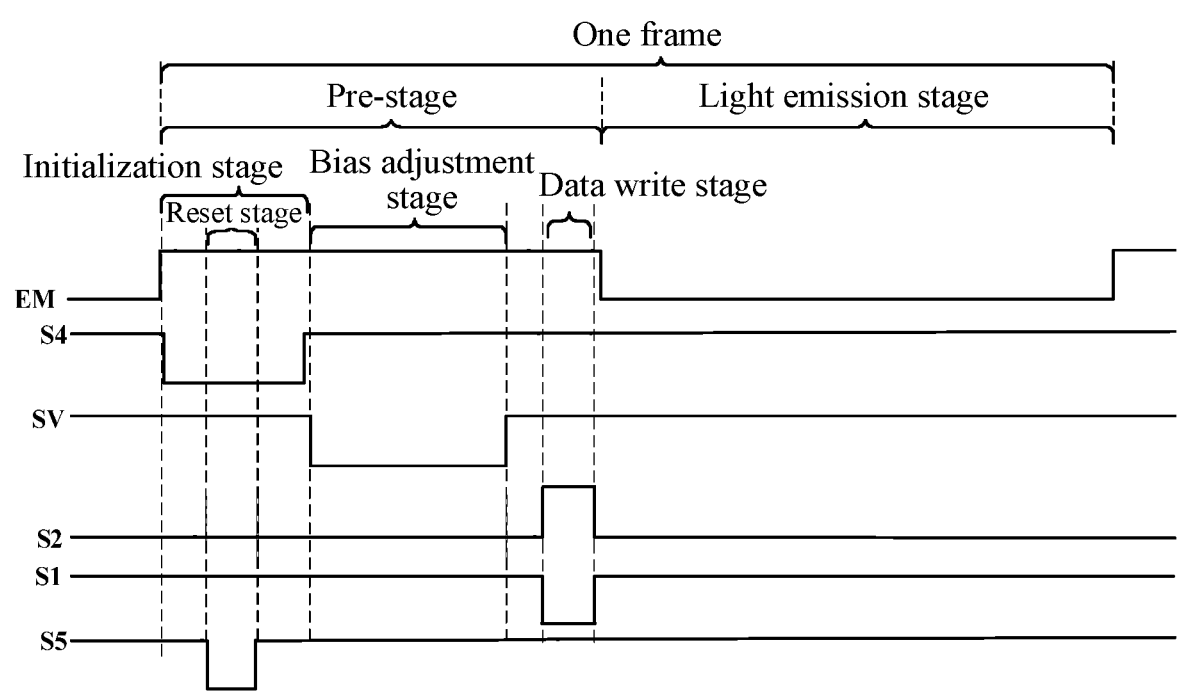
FIG. 13 is a timing diagram of the pixel circuit of FIG. 12.

FIG. 13 is a timing diagram of the pixel circuit of FIG. 12. As shown in FIG. 13, in the initialization stage, the scan signal S4 outputs an effective pulse to control the initialization device 16 to be turned on and the initialization signal Vini is written into the anode of the light-emitting element 20, and thus the initialization of the light-emitting element 20 can be achieved. At least part of the time period of the initialization stage also serves as the reset stage. In the reset stage, the scan signal S5 outputs an effective pulse to control the switching device 161 to be turned on and the initialization signal Vini is written into the gate of the drive transistor T2 through the turned-on initialization device 16 and the turned-on switching device 161, and thus the drive transistor T2 can be reset.

Figure 14:
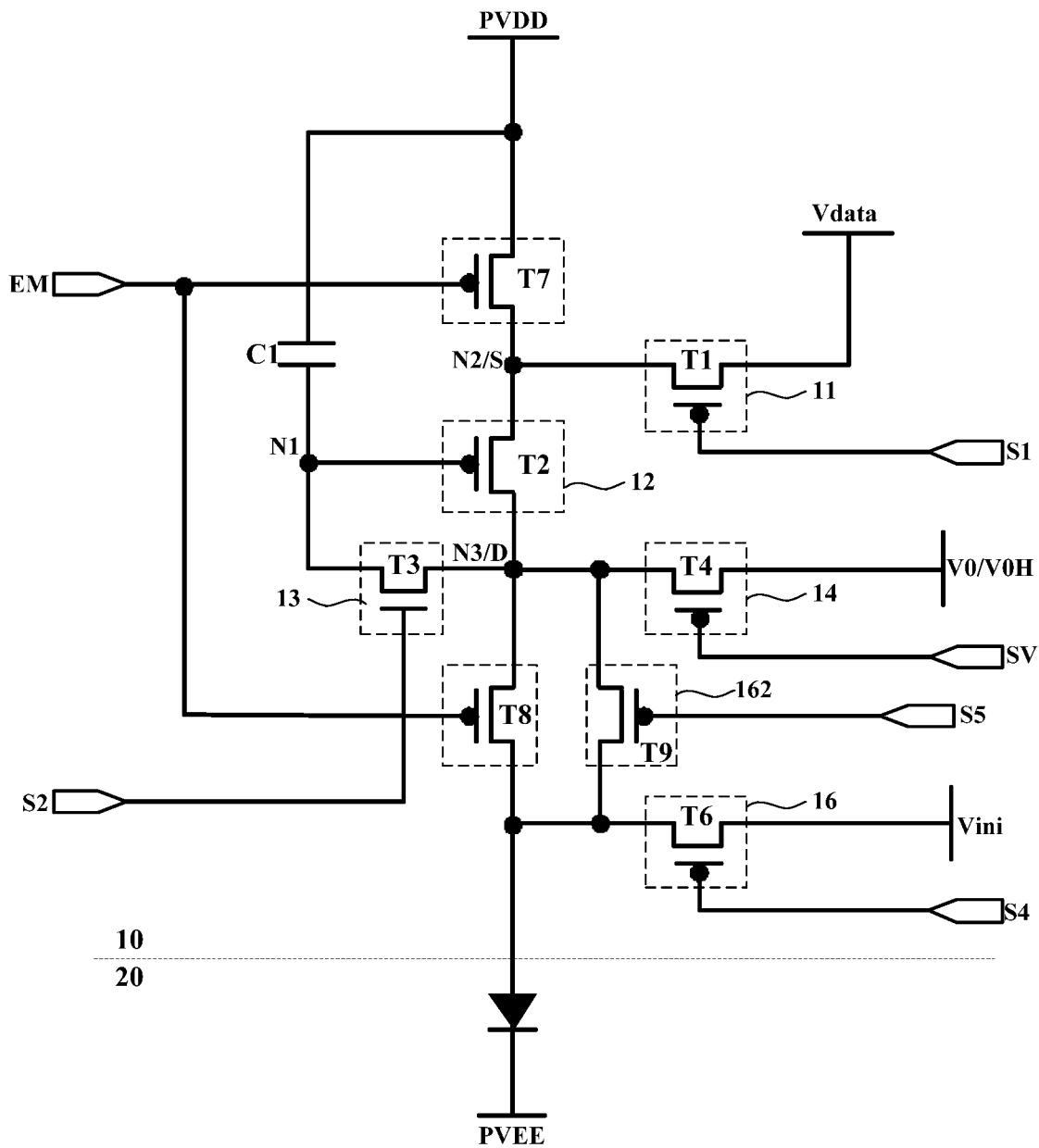
FIG. 14 is a structure diagram of a pixel circuit of the display panel according to another embodiment of the present disclosure.

Referring to FIG. 14, FIG. 14 is a structure diagram of a pixel circuit of the display panel according to another embodiment of the present disclosure. As shown in FIG. 14, in an embodiment, the drive transistor T2 is a PMOS transistor, and the pixel circuit 10 further includes a switching device 162. One end of the switching device 162 is connected to the light-emitting element 20, and the other end of the switching device 162 is connected to the drain D of the drive transistor T2. During at least part of the time period of the initialization stage, the initialization device 16 is turned on, the switching device 162 and the compensation device 13 are turned on, the initialization signal Vini also serves as a reset signal, and the reset signal is provided to the gate of the drive transistor T2.

In this embodiment, the control terminal of the switching device 162 is configured to receive the scan signal S5, the first terminal of the switching device 162 is connected to the anode of the light-emitting element 20, and the second terminal of the switching device 162 is connected to the drain D of the drive transistor T2, that is, the node N3. The scan signal S5 received by the pixel circuit 10 is a pulse signal, and the effective pulse of the scan signal S5 controls the transmission path between the first terminal of the switching device 162 and the second terminal of the switching device 162 to be turned on. The invalid pulse of the scan signal S5 controls the transmission path between the first terminal of the switching device 162 and the second terminal of the switching device 162 to be turned off.

The working process of the pixel circuit 10 further includes the initialization stage. In this embodiment, at least part of the time period of the initialization stage also serves as the reset stage. In an embodiment, the gate of the drive transistor T2 is reset through the initialization device 16, the switching device 162, and the compensation device 13.

Figure 15:
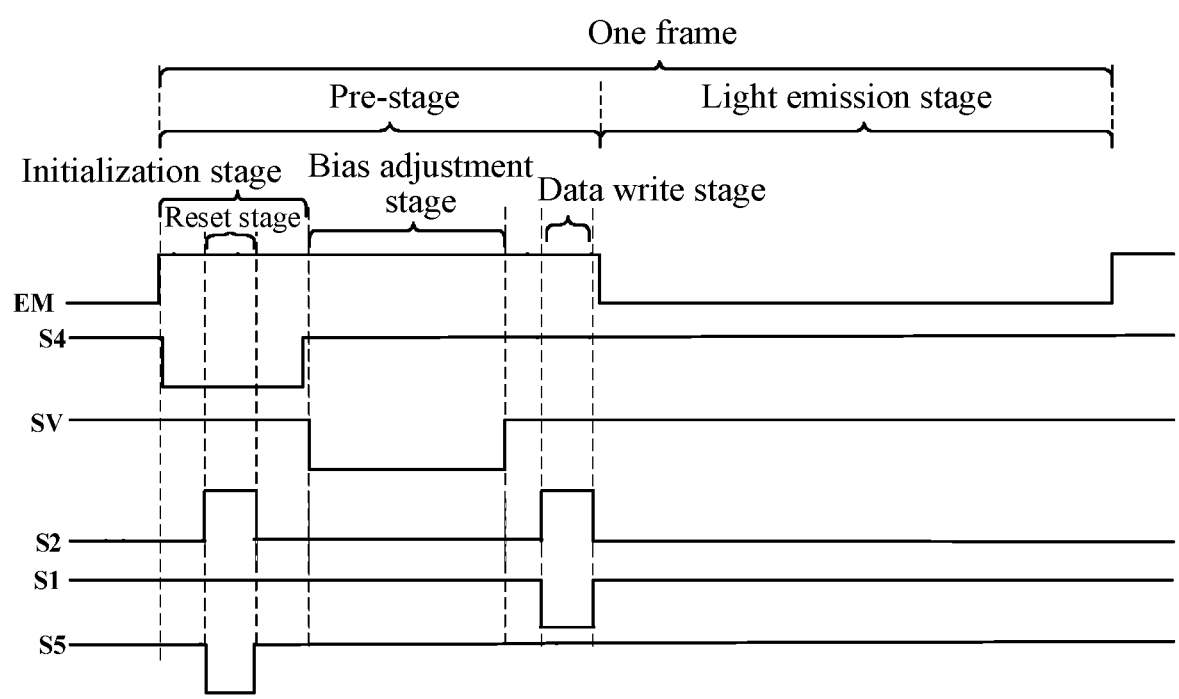
FIG. 15 is a timing diagram of the pixel circuit of FIG. 14.

FIG. 15 is a timing diagram of the pixel circuit of FIG. 14. As shown in FIG. 15, in the initialization stage, the scan signal S4 outputs an effective pulse to control the initialization device 16 to be turned on and the initialization signal Vini is written into the anode of the light-emitting element 20, and thus the initialization of the light-emitting element 20 can be achieved. At least part of the time period of the initialization stage also serves as the reset stage. In the reset stage, the scan signal S5 outputs an effective pulse to control the switching device 162 to be turned on, and the scan signal S2 outputs an effective pulse to control the compensation device 13 to be turned on and the initialization signal Vini is written into the gate of the drive transistor T2 through the turned-on initialization device 16, the turned-on switching device 162, and the turned-on compensation device 13, and thus the drive transistor T2 can be reset.

For the switching device shown in FIGS. 12 and 14, in an embodiment, the switching device includes a ninth transistor T9, a gate of the ninth transistor T9 is configured to receive the scan signal S5, a first pole of the ninth transistor T9 is connected to the anode of the light-emitting element 20, and a second pole of the ninth transistor T9 is connected to the gate or drain of the drive transistor T2. In an embodiment, the ninth transistor T9 is PMOS, which may be a low-temperature polysilicon semiconductor transistor. In other embodiments, the ninth transistor may also be NMOS and an oxide semiconductor transistor, and may be an indium gallium zinc oxide (IGZO) semiconductor transistor, which is not limited herein.

It is to be noted that, in the structure in FIG. 14, further, the switching device 162 also serves as a light-emitting control device, that is, T8 and T9 in the figure may be a same transistor. In this case, an EM signal received by the control terminal of T8 and an EM signal received by the control terminal of T7 are different signals, and the EM signal received by the control terminal of T8 also serves as the signal S5 and the number of transistors can be reduced, and thus the panel space can be saved.

By way of example, referring to FIG. 2, in an embodiment, the pixel circuit 10 further includes the initialization device 16. One end of the initialization device 16 is connected to the initialization signal terminal and is configured to receive the initialization signal Vini, and the other end of the initialization device 16 is connected to the light-emitting element 20. In the initialization stage, the initialization device 16 is turned on and the initialization signal Vini is provided to the light-emitting element 20. It is to be understood that FIG. 2 is only an example of one of the pixel circuits, and this figure only illustrates the connection between the initialization device 16 and the light-emitting element 20. The control terminal of the initialization device 16 is configured to receive the scan signal S4, and the scan signal S4 is a pulse signal. In an embodiment, the initialization device 16 includes the sixth transistor T6, the gate of the sixth transistor T6 is configured to receive the scan signal S4, the input terminal is connected to the initialization signal terminal, and the output terminal is connected to the anode of the light-emitting element 20. In an embodiment, the sixth transistor T6 is PMOS; in other embodiments, the sixth transistor may also be NMOS, which is not limited herein.

Figure 16:
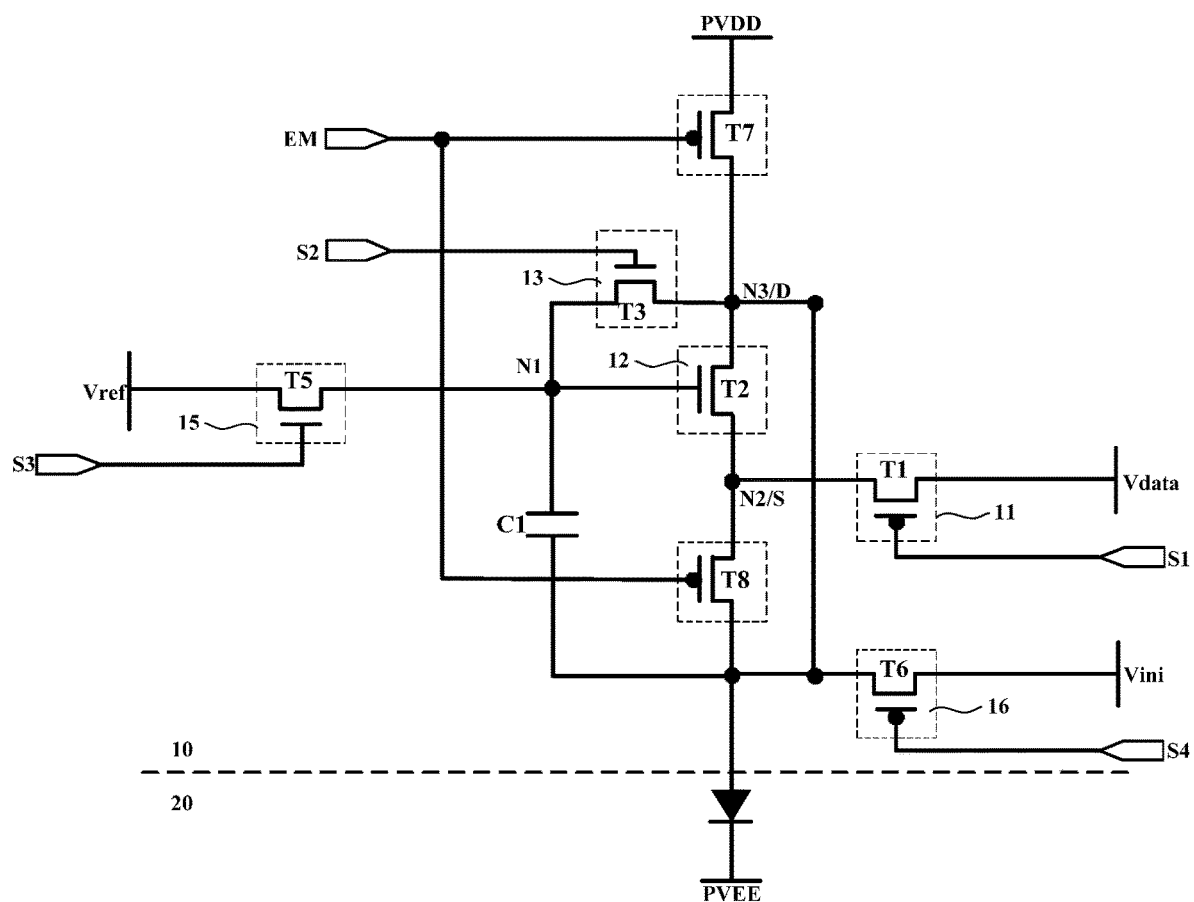
FIG. 16 is a structure diagram of a pixel circuit of the display panel according to another embodiment of the present disclosure.
Figure 17:
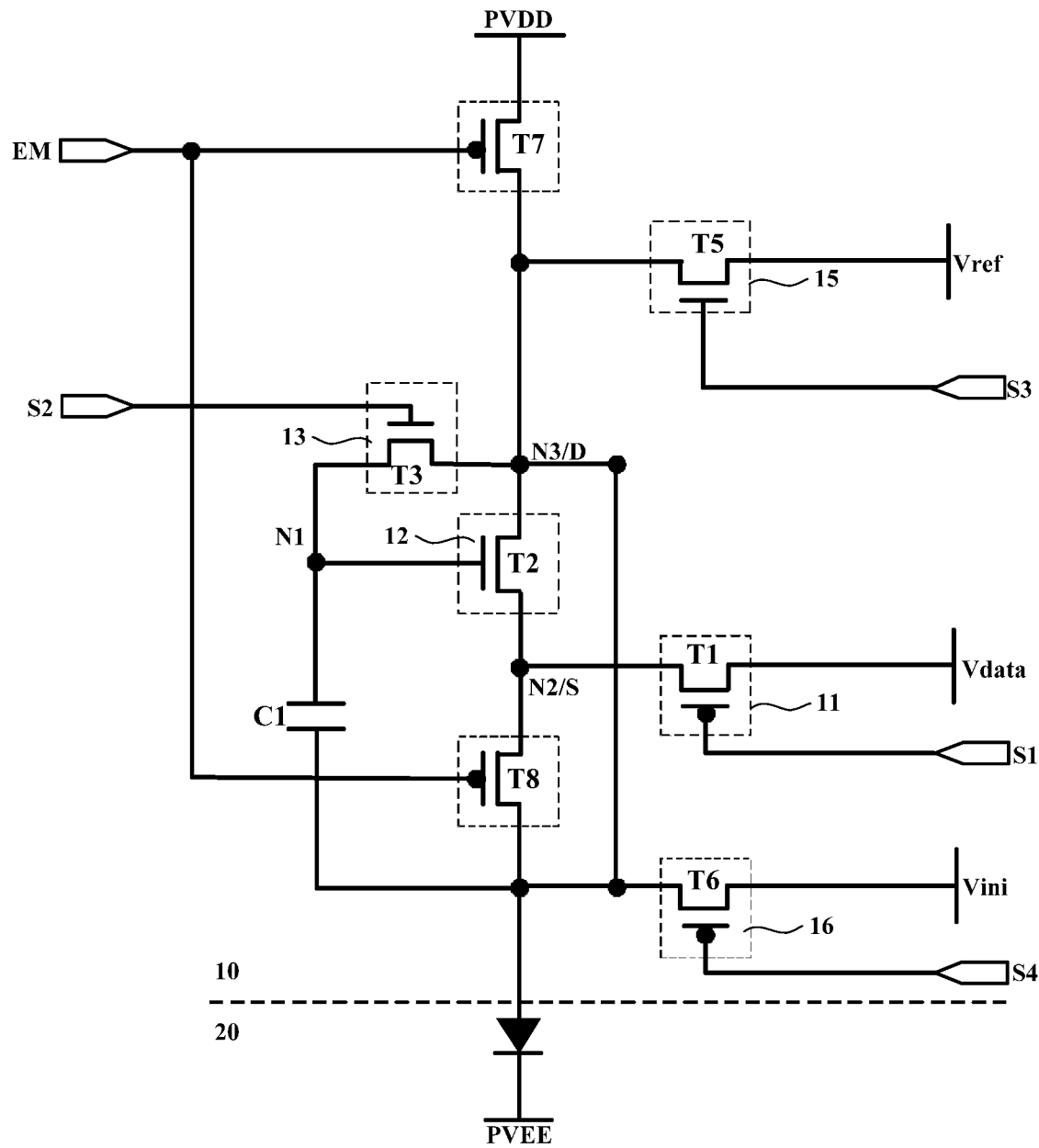
FIG. 17 is a structure diagram of a pixel circuit of the display panel according to another embodiment of the present disclosure.

Referring to FIG. 16, FIG. 16 is a structure diagram of a pixel circuit of the display panel according to another embodiment of the present disclosure. Referring to FIG. 17, FIG. 17 is a structure diagram of a pixel circuit of the display panel according to another embodiment of the present disclosure. Referring to FIGS. 16 and 17, in an embodiment, the drive transistor T2 is an NMOS transistor, the initialization device 16 is connected to one end of the light-emitting element 20 and is also connected to the drain of the drive transistor T2, the initialization device 16 also serves as the bias adjustment device, and the initialization signal Vini also serves as the bias adjustment signal. In the initialization stage, the initialization device 16 provides the initialization signal Vini for the light-emitting element 20 and provides the bias adjustment signal to the drain of the drive transistor T2.

In an embodiment, the pixel circuit 10 further includes the reset device 15. One end of the reset device 15 is connected to the reset signal terminal and is configured to receive the reset signal Vref, and the other end of the reset device 15 is connected to the gate or drain of the drive transistor T2. In the reset stage, the reset device 15 provides the reset signal Vref to the gate of the drive transistor T2. As shown in FIG. 16, the other end of the reset device 15 is connected to the gate of the drive transistor T2, that is, the first node N1; as shown in FIG. 17, the other end of the reset device 15 is connected to the drain of the drive transistor T2, that is, the third node N3.

The working process of the pixel circuit 10 further includes the initialization stage and the reset stage. In this embodiment, the initialization stage also serves as the bias adjustment stage. For the NMOS drive transistor T2, the reset signal Vref is usually a positive voltage signal. The initialization signal Vini is usually a negative voltage signal. In the initialization stage, the initialization signal Vini is written into the anode of the light-emitting element 20 and the initial voltage of the anode of the light-emitting element 20 remains negative.

As shown in FIG. 16, in the reset stage, the scan signal S3 is output as an effective pulse and the reset signal Vref with a positive voltage is provided to the gate of the drive transistor T2 through the reset device 15. The compensation device 13 is turned off, and the voltage of the gate of the drive transistor T2 is positive and the gate of the drive transistor T2 can be reset. In the initialization stage, that is, the bias adjustment stage, the compensation device 13 is turned off, and the scan signal S4 is output as an effective pulse and the initialization signal Vini with a negative voltage is provided to the anode of the light-emitting element 20 through the initialization device 16, and thus the anode initialization of the light-emitting element 20 is achieved; at the same time, the initialization signal Vini also serves as the bias adjustment signal and is provided to the drain D of the drive transistor T2 through the initialization device 16 and the voltage of the drain of the drive transistor T2 is negative, the potential of the drain of the drive transistor T2 is lower than the potential of the gate of the drive transistor T2, and thus the reverse bias of the drive transistor T2 is achieved.

Figure 18:
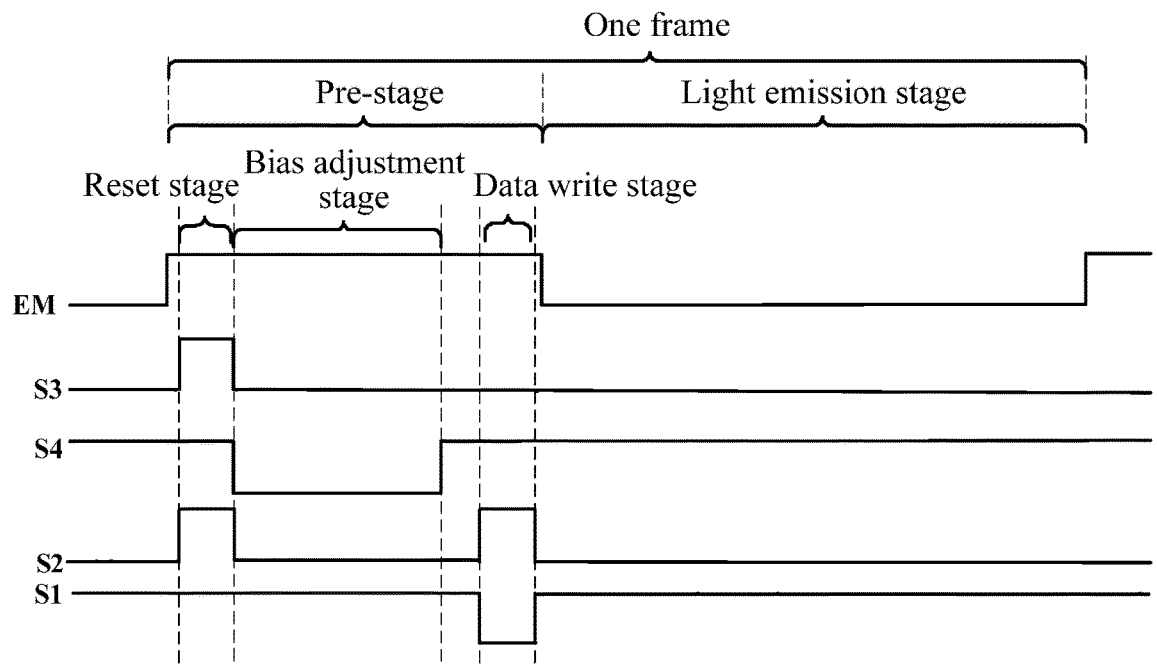
FIG. 18 is a timing diagram of the pixel circuit of FIG. 17.

FIG. 18 is a timing diagram of the pixel circuit of FIG. 17. In conjunction with FIGS. 17 and 18, in the reset stage, the scan signals S3 and S2 are output as effective pulses and the reset signal Vref with a positive voltage is provided to the gate of the drive transistor T2 through the reset device 15 and the compensation device 13, and thus the gate of the drive transistor T2 is reset. In the initialization stage, that is, the bias adjustment stage, the compensation device 13 is turned off, and the scan signal S4 is output as an effective pulse and the initialization signal Vini with a negative voltage is provided to the anode of the light-emitting element 20 through the initialization device 16, and thus the anode initialization of the light-emitting element 20 is achieved. At the same time, the initialization signal Vini also serves as the bias adjustment signal and is provided to the drain D of the drive transistor T2 through the initialization device 16 and the voltage of the drain of the drive transistor T2 is negative, the potential of the drain of the drive transistor T2 is lower than the potential of the gate of the drive transistor T2, and thus the reverse bias of the drive transistor T2 is achieved.

In this embodiment, the drive transistor T2 is NMOS. In an embodiment, the initialization device also serves as the bias adjustment device. In the bias adjustment stage, the potential of the drain Vini of the drive transistor T2 is lower than the potential of the gate Vref of the drive transistor T2, that is, the potential of the third node N3 is lower than the potential of the first node N1 and the reverse bias of the drive transistor T2 is achieved, and weakening the degree of ion polarization inside the drive transistor T2 and reducing the threshold voltage of the drive transistor T2. The threshold voltage of the drive transistor T2 is adjusted by biasing the drive transistor T2 and the potential difference between the potential of the gate of the drive transistor and the potential of the drain of the drive transistor T2 is ameliorated.

Figure 19:
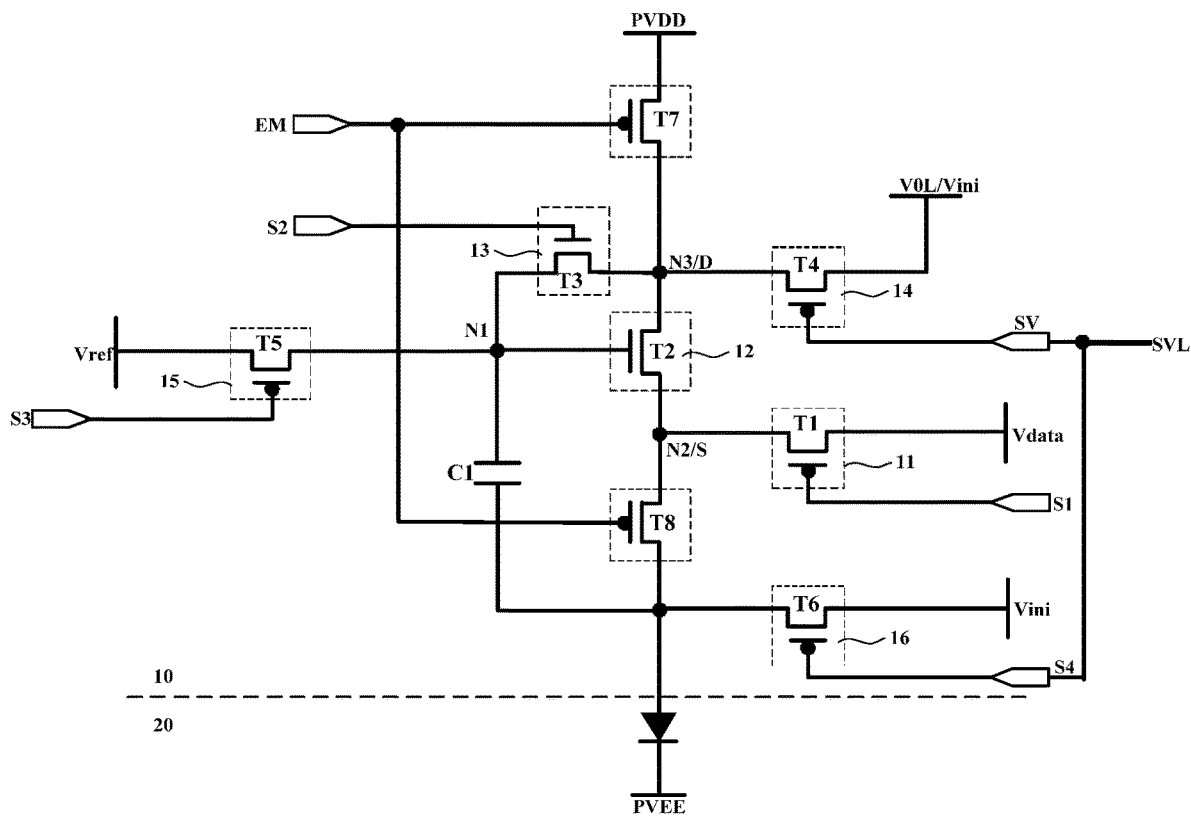
FIG. 19 is a structure diagram of a pixel circuit of the display panel according to another embodiment of the present disclosure.

By way of example, referring to FIG. 19, FIG. 19 is a structure diagram of a pixel circuit of the display panel according to another embodiment of the present disclosure. As shown in FIG. 19, in an embodiment, the pixel circuit 10 further includes the initialization device 16. One end of the initialization device 16 is connected to the initialization signal terminal and is configured to receive the initialization signal Vini, and the other end of the initialization device 16 is connected to the light-emitting element 20. In the initialization stage, the initialization device 16 is turned on and the initialization signal Vini is provided to the light-emitting element 20. The control terminal of the initialization device 16 is configured to receive the scan signal S4. In an embodiment, the initialization device 16 includes the sixth transistor T6, and the sixth transistor T6 is PMOS; in other embodiments the sixth transistor may also be NMOS, which is not limited herein. In an embodiment, the initialization stage and the bias adjustment stage are performed at a same time. The control terminal of the initialization device 16 and the control terminal of the bias adjustment device 14 are connected to a same scan signal line SVL. In the initialization stage, the scan signal line SVL controls the initialization device 16 and the bias adjustment device 14 to be turned on at a same time.

The pixel circuit 10 includes the initialization device 16 and the bias adjustment device 14. In the initialization stage, the effective signal output by the scan signal S4 turns on the initialization device 16, and the initialization signal Vini initializes the anode of the light-emitting element 20. In the bias adjustment stage, the effective signal output by the scan signal SV turns on the bias adjustment device 14, and the bias adjustment signal V0L is written into the drain of the drive transistor T2.

In this embodiment, the control terminal of the initialization device 16 and the control terminal of the bias adjustment device 14 are connected to the same scan signal line SVL, and the scan signal line SVL controls the initialization device 16 and the bias adjustment device 14 to be turned on at a same time. In an embodiment, the initialization device 16 and the bias adjustment device 14 are both PMOS; in other embodiments, the initialization device and the bias adjustment device are both NMOS. In such arrangement, the initialization stage and the bias adjustment stage are performed at a same time. It is to be understood that the signal output from the scan signal line SVL and input to the initialization device 16 is the scan signal S4, the signal output from the scan signal line SVL and input into the bias adjustment device 14 is the scan signal SV, and S4 and SV are same signal.

Referring to FIG. 19, in an embodiment, the pixel circuit 10 further includes the reset device 15. One end of the reset device 15 is connected to the reset signal terminal and is configured to receive the reset signal Vref, and the other end of the reset device 15 is connected to the gate of the drive transistor T2. In the reset stage, the reset device 15 is turned on and the reset signal is provided to the gate of the drive transistor T2. The control terminal of the initialization device 16, the control terminal of the bias adjustment device 14, and the control terminal of the reset device 15 are all connected to the same scan signal line. In the initialization stage, the scan signal line controls the initialization device, the bias adjustment device, and the reset device to be turned on at a same time.

In this embodiment, the control terminal of the initialization device 16, the control terminal of the reset device 15, and the control terminal of the bias adjustment device 14 are connected to the same scan signal line SVL, the scan signal line SVL controls the initialization device 16, the reset device 15, and the bias adjustment device 14 to be turned on at a same time, and the compensation device 13 is turned off. In an embodiment, the initialization device 16, the reset device 15, and the bias adjustment device 14 are all PMOS; in other embodiments, the initialization device, the reset device, and the bias adjustment device are all NMOS. In such arrangement, the reset stage and the bias adjustment stage are performed at a same time. It is to be understood that the signal output from the scan signal line SVL and input into the initialization device 16 is the scan signal S4, the signal output from the scan signal line SVL and input into the reset device 15 is the scan signal S3, the signal output from the scan signal line SVL and input into the bias adjustment device 14 is the scan signal SV, and S3, S4, and SV are same signal.

Figure 20:
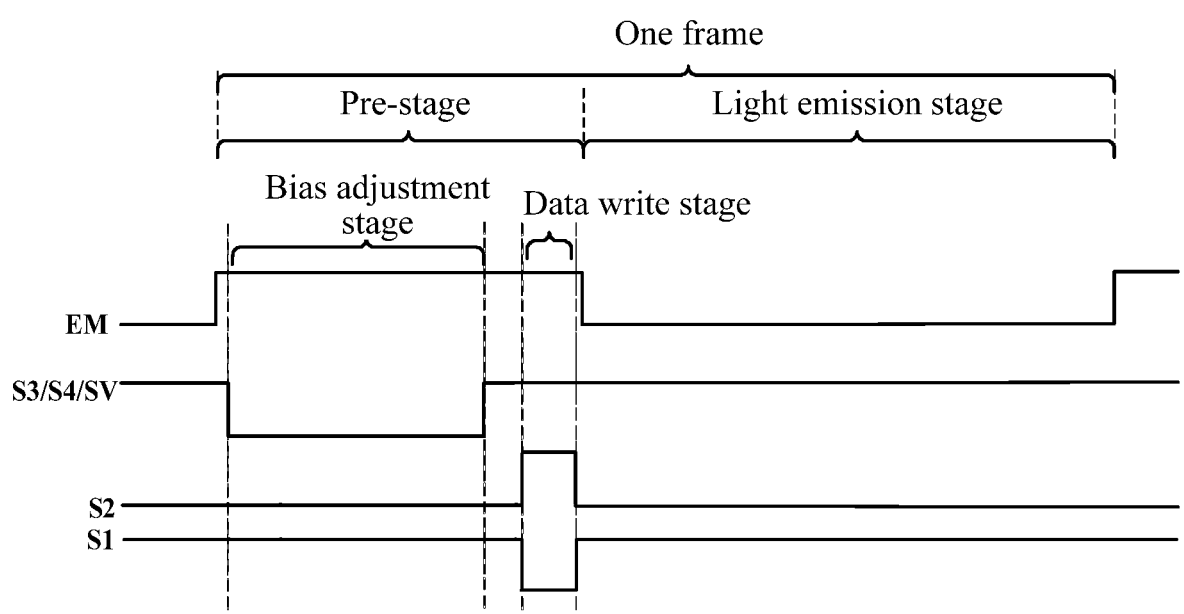
FIG. 20 is a timing diagram of the pixel circuit of FIG. 19.

FIG. 20 is a timing diagram of the pixel circuit of FIG. 19. In conjunction with FIGS. 19 and 20, in the bias adjustment stage, the scan signal line SVL outputs a low-level signal to turn on the initialization device 16, and the initialization signal Vini with a negative voltage is provided to the anode of the light-emitting element 20 through the initialization device 16 and the initialization of the anode of the light-emitting element 20 is achieved; at the same time, the scan signal line SVL outputs a low-level signal to turn on the reset device 15, and the reset signal Vref with a positive voltage is provided to the gate of the drive transistor T2 through the reset device 15 and the gate of the drive transistor T2 is reset; at the same time, the scan signal line SVL output a low-level signal to turn on the bias adjustment device 14, and the bias adjustment signal V0L is provided to the drain D of the drive transistor T2 through the bias adjustment device 14; at the same time, the scan signal S2 output a low-level signal and the compensation device 13 is turned off.

As described above, in the bias adjustment stage, the voltage of the gate of the drive transistor T2 is positive, the drain of the drive transistor T2 is at a low level, and the potential of the drain V0L of the drive transistor T2 is lower than the potential of the gate Vref of the drive transistor T2 and the reverse bias of the drive transistor T2 is achieved, and weakening the degree of ion polarization inside the drive transistor T2 and reducing the threshold voltage of the drive transistor T2. The threshold voltage of the drive transistor T2 is adjusted by biasing the drive transistor T2 and the potential difference between the potential of the gate of the drive transistor and the potential of the drain of the drive transistor T2 is ameliorated.

In an embodiment, the initialization signal Vini is a low-level signal, the drive transistor T2 is an NMOS transistor, and the initialization signal Vini and the bias adjustment signal V0L are the same signal. In an embodiment, the display panel includes an initialization signal line, and the bias adjustment signal terminal is connected to the initialization signal line. Referring to FIG. 19, in an embodiment, the initialization signal Vini and the bias adjustment signal V0L are a same low-level signal with, for example, a negative voltage. In such arrangement, in the initialization stage, the initialization signal Vini is written into the anode of the light-emitting element 20 through the turned-on initialization device 16 to initialize the anode of the light-emitting element 20; and in the bias adjustment stage, the bias adjustment signal V0L is written into the drain of the drive transistor T2 through the turned-on bias adjustment device 14 and the drain D of the drive transistor T2 is at a low level, and thus the reverse bias of the drive transistor T2 is achieved.

For the pixel circuit structure of any one of the preceding embodiments shown in FIGS. 1 to 20, in an embodiment, the pixel circuit 10 includes a first light-emitting control device 17, and the light-emitting control device 17 is connected between a first power supply voltage signal terminal PVDD and the drive device 12. The first power supply voltage signal terminal PVDD provides a high-level signal Vdd, the drive transistor T2 is a PMOS transistor, and the high-level signal Vdd provided by the first power supply voltage signal terminal PVDD and the bias adjustment signal V0H are same signal. In one frame of image displayed, the working process of the pixel circuit 10 includes a pre-stage and a light emission stage that are sequentially executed. The pre-stage is a non-light-emission stage in which operations such as reset, initialization, bias adjustment, and data writing are mainly executed. The light emission stage is configured to drive the pixel circuit 10 to cause the light-emitting element 20 to emit light.

In this embodiment, an input terminal of the first light-emitting control device 17 is configured to receive the high-level signal Vdd, a control terminal of the first light-emitting control device 17 is configured to receive a light-emitting control signal EM, and an output terminal of the first light-emitting control device 17 is electrically connected to the source S of the drive device 12 or the drain D of the drive device 12. The light-emitting control signal EM received by the pixel circuit 10 is a pulse signal. In the pre-stage, the light-emitting control signal EM is an invalid pulse to turn off the first light-emitting control device 17; in the light emission stage, the light-emitting control signal EM is an effective pulse to control the first light-emitting control device 17 to be turned on and the high-level signal Vdd flows into one end of the drive device 12, and thus the drive current provided by the drive transistor T2 flows into the light-emitting element 20 to cause the light-emitting element 20 to emit light. Therefore, under the control of the light-emitting control signal EM, the first light-emitting control device 17 controls the light-emitting element 20 to emit light or not.

In a case where the drive transistor T2 is a PMOS transistor, the bias adjustment signal is a high-level signal. In the pixel circuit 10, the first power supply voltage signal terminal PVDD provides a high-level signal, and the high-level signal Vdd provided by the first power supply voltage signal terminal PVDD and the bias adjustment signal V0H are same signal.

In an embodiment, the display panel includes a first power supply voltage signal line, the bias adjustment signal terminal is connected to the first power supply voltage signal line, and the first power supply voltage signal terminal is connected to the first power supply voltage signal line. In this embodiment, the display panel includes one first power supply voltage signal line, and electrical signal provided by the first power supply voltage signal line is applied to the first power supply voltage signal terminal PVDD, and the high-level signal Vdd is provided to the pixel circuit 10; and at the same time, the electrical signal provided by the first power supply voltage signal line is applied to the bias adjustment signal terminal and the bias adjustment signal V0H is provided to the bias adjustment device 14. An input electrical signal is provided to the bias adjustment device 14 by using the existing first power supply voltage signal line, and an additional bias adjustment signal line does not need to be added.

For the pixel circuit structure of any one of the preceding embodiments shown in FIGS. 1 to 20, in an embodiment, the display panel includes a bias adjustment signal line, and the bias adjustment signal terminal is connected to the bias adjustment signal line. In this embodiment, the display panel includes one bias adjustment signal line, and the electrical signal provided by the bias adjustment signal line is applied to the bias adjustment signal terminal and the bias adjustment signal V0 is provided to the bias adjustment device 14. For example, in a case where the drive transistor T2 is a PMOS transistor, the bias adjustment signal line provides a high-level signal V0H to the bias adjustment signal terminal; and in a case where the drive transistor T2 is an NMOS transistor, the bias adjustment signal line provides a low-level signal V0L to the bias adjustment signal terminal. It is to be understood that the high-level signal V0H or the low-level signal V0L provided by the bias adjustment signal line to the bias adjustment signal terminal must ensure that the reverse bias of the drive transistor T2 is achieved in the bias adjustment stage. Specific values the high-level signal V0H or the low-level signal V0L are not limited herein.

Figure 21:
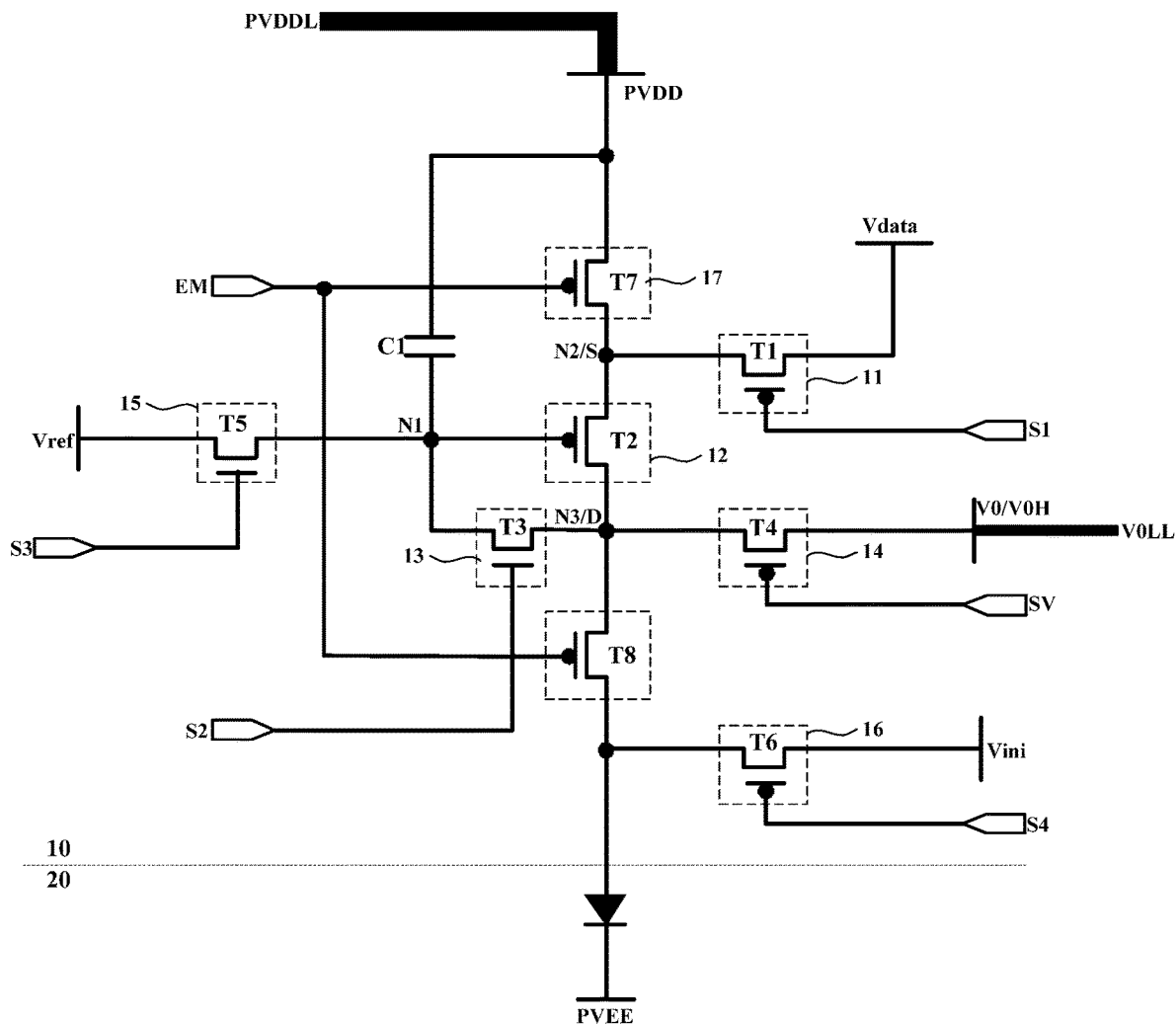
FIG. 21 is a structure diagram of a pixel circuit of the display panel according to another embodiment of the present disclosure.

Referring to FIG. 21, FIG. 21 is a structure diagram of a pixel circuit of the display panel according to another embodiment of the present disclosure. As shown in FIG. 21, in an embodiment, the pixel circuit 10 includes the first light-emitting control device 17, the first light-emitting control device 17 is connected between the first power supply voltage signal terminal PVDD and the drive device 12, the display panel further includes a first power supply voltage signal line PVDDL, and the first power supply voltage signal line PVDDL is configured to transmit a first power supply voltage signal Vdd to the first power supply voltage signal terminal PVDD. A width of the bias adjustment signal line V0LL is lower than a width of the first power supply voltage signal line PVDDL.

In this embodiment, the first power supply voltage signal line PVDDL applies the first power supply voltage signal Vdd to the pixel circuit 10 and in the light emission stage, the drive transistor T2 provides the drive current for the light-emitting element 20 to control the light-emitting element 20 to emit light. Apparently, the first power supply voltage signal Vdd provided by the first power supply voltage signal line PVDDL to the pixel circuit 10 must ensure that the light-emitting element 20 may normally emit light. The bias adjustment signal line V0LL provides the bias adjustment signal to the bias adjustment device 14. One embodiment of the bias adjustment signal is to adjust the potential of the drain of the drive transistor, and the bias adjustment signal does not participate in the generation of the drive current. The first power supply voltage signal Vdd is an important signal involved in the generation of the drive current. Therefore, the requirement for the accuracy of the first power supply voltage signal Vdd is higher. In an embodiment, the width of the bias adjustment signal line V0LL is lower than the width of the first power supply voltage signal line PVDDL and it is ensured that the resistance on the first power supply voltage signal line PVDDL is relatively small, and avoiding the loss of the first power supply voltage signal and ensuring that the signal is accurate.

In an embodiment, the bias adjustment signal line V0LL extends in a same direction as the first power supply voltage signal line PVDDL. In the specific manufacturing process, in an embodiment, the bias adjustment signal line V0LL and the first power supply voltage signal line PVDDL are located in a same metal layer or located in different metal layers and are electrically connected to the pixel circuit 10 through a structure such as a via hole. In this embodiment, the bias adjustment signal is usually provided by an integrated chip or a flexible circuit board, the first power supply voltage signal Vdd is also provided by an integrated chip or a flexible circuit board, and the integrated chip or flexible circuit board is usually located on a lower frame of the display panel, as the drive circuit is usually disposed on two side frames of the display panel. To save spacing of the display panel, in this embodiment, the bias adjustment signal line V0LL is configured to extend in a same direction as the first power supply voltage signal line PVDDL; and to further save the space of the panel, the width of the bias adjustment signal line may be set to be relatively small and it can prevent the two signal lines from occupying too much space when the two signal lines extend in a same direction and can avoids that the resolution of the display panel is affected.

Figure 22:
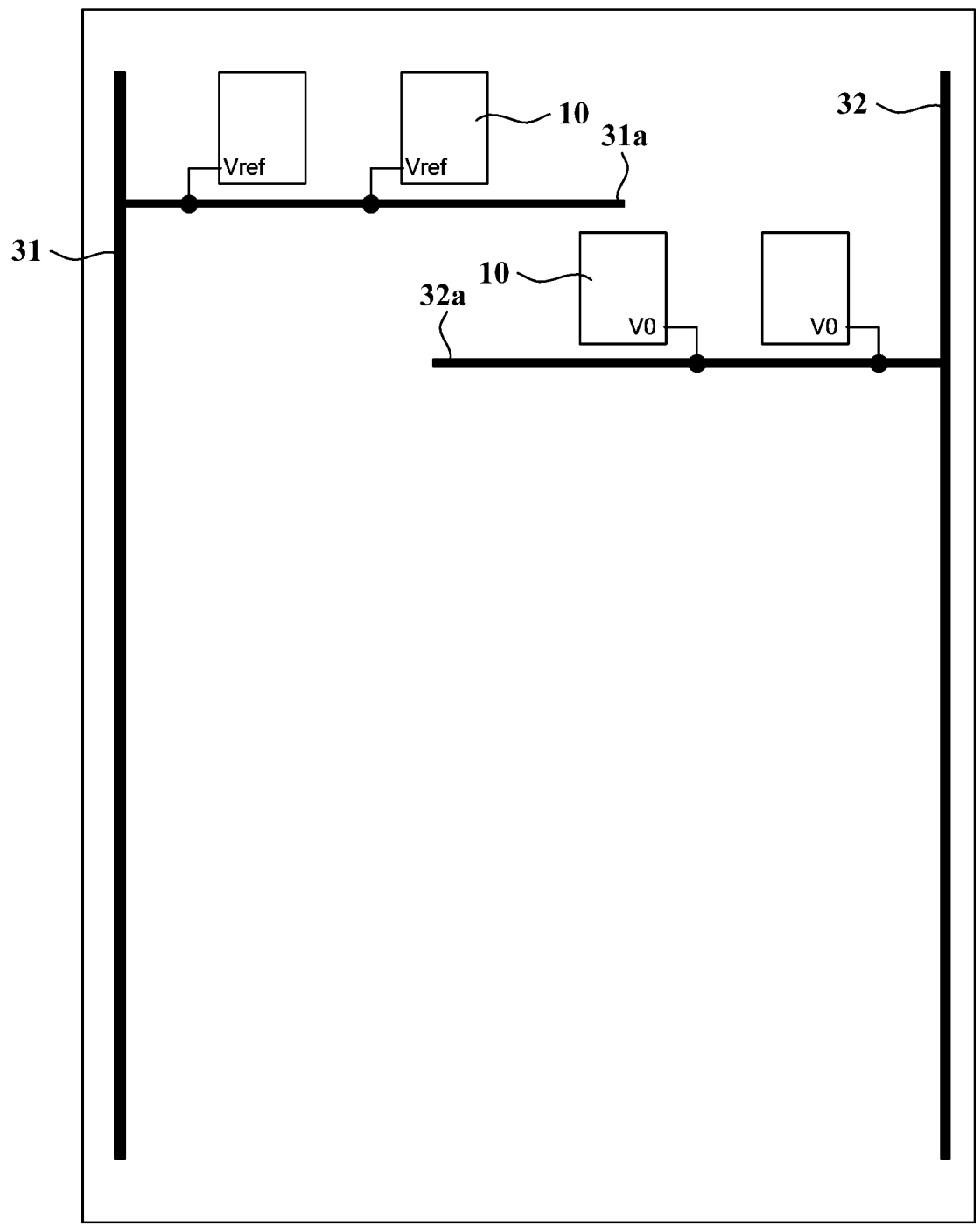
FIG. 22 is a schematic diagram of a display panel according to an embodiment of the present disclosure.

Referring to FIG. 22, FIG. 22 is a schematic diagram of a display panel according to an embodiment of the present disclosure. As shown in FIG. 22, in an embodiment, the display panel further includes at least one of a reset signal line 31a and an initialization signal line, at least one side frame of the display panel includes at least one of a reset signal bus 31 and an initialization signal bus, and the reset signal line 31a is connected to the reset signal bus 31, or the initialization signal line is connected to the initialization signal bus; the display panel further includes a bias adjustment signal bus 32, the bias adjustment signal bus 32 is located on at least one side frame of the display panel, and a bias adjustment signal line 32a is connected to the bias adjustment signal bus 32. The bias adjustment signal line 32a extends in a same direction as at least one of the reset signal line 31a and the initialization signal line.

In this embodiment, only the case where the display panel further includes the reset signal line 31a is used as an example for description, and the design with the initialization signal line and the initialization signal bus may refer to the design with the reset signal line and the reset signal bus, which will not be repeated herein. One side frame of the display panel is provided with the reset signal bus 31. In the figure, in an embodiment, the reset signal bus 31 is disposed on a frame of the left side of long sides of the display panel. In other embodiments, the reset signal bus may also extend to two or more side frames of the display panel. Embodiments of the disclosure can reasonably design the reset signal bus according to product requirements. For example, in an embodiment, the reset signal bus may surround the display region of the display panel. The reset signal bus 31 provides the reset signal Vref to each pixel circuit 10. In an embodiment, the display panel includes multiple rows of pixel circuits 10. In an embodiment, each row of pixel circuits 10 may be provided with one reset signal line 31a. The reset signal terminal of each pixel circuit 10 in one row is connected to a corresponding reset signal line 31a, and each reset signal line 31a is electrically connected to the reset signal bus 31 and the reset signal Vref provided by the reset signal bus 31 is transmitted to the reset signal terminal of each pixel circuit 10 through each reset signal line 31a.

One side frame of the display panel is provided with the bias adjustment signal bus 32. In the figure, in an embodiment, the bias adjustment signal bus 32 is disposed on a frame of the right side of the long sides of the display panel. In other embodiments, the bias adjustment signal bus may also extend to two or more side frames of the display panel, which is not limited herein. The bias adjustment signal bus 32 provides the bias adjustment signal V0 for each pixel circuit 10. In an embodiment, each row of pixel circuits 10 may be provided with one bias adjustment signal line 32a, the bias adjustment signal terminal of each pixel circuit 10 in one row is connected to a corresponding bias adjustment signal line 32a, and each bias adjustment signal line 32a is electrically connected to the bias adjustment signal bus 32 and the bias adjustment signal V0 provided by the bias adjustment signal bus 32 is transmitted to the bias adjustment signal terminal of each pixel circuit 10 through each bias adjustment signal line 32a.

In this embodiment, the bias adjustment signal line 32a extends in a same direction as the reset signal line 31a, and in an embodiment, the extension direction of the bias adjustment signal line 32a is parallel to an extension direction of a side frame of short sides of the display panel.

As shown in FIG. 22, in an embodiment, the bias adjustment signal bus 32 is located on a first side frame of the display panel, at least one of the reset signal bus 31 and the initialization signal bus is located on a second side frame of the display panel, and the first side frame is adjacent to or opposite to the second side frame. As shown in FIG. 22, in an embodiment, the first side frame of the display panel is the right side frame of the long sides, the second side frame of the display panel is the left side frame of the long sides, and the first side frame is opposite to the second side frame. The bias adjustment signal bus 32 and at least one of the reset signal bus 31 and the initialization signal bus are located on different side frames. In such arrangement, the bias adjustment signal line 32a and the bias adjustment signal bus 32 are connected on the first side frame, the reset signal line 31a and the reset signal bus 31 are connected on the second side frame, and no interference exists. At the same time, such wiring is conducive to achieving a more uniform wiring distribution on two side frames, and avoiding the problem of dense wiring on one side and sparse wiring on the other side, and saving the space on two side frames in a better manner.

Figure 23:
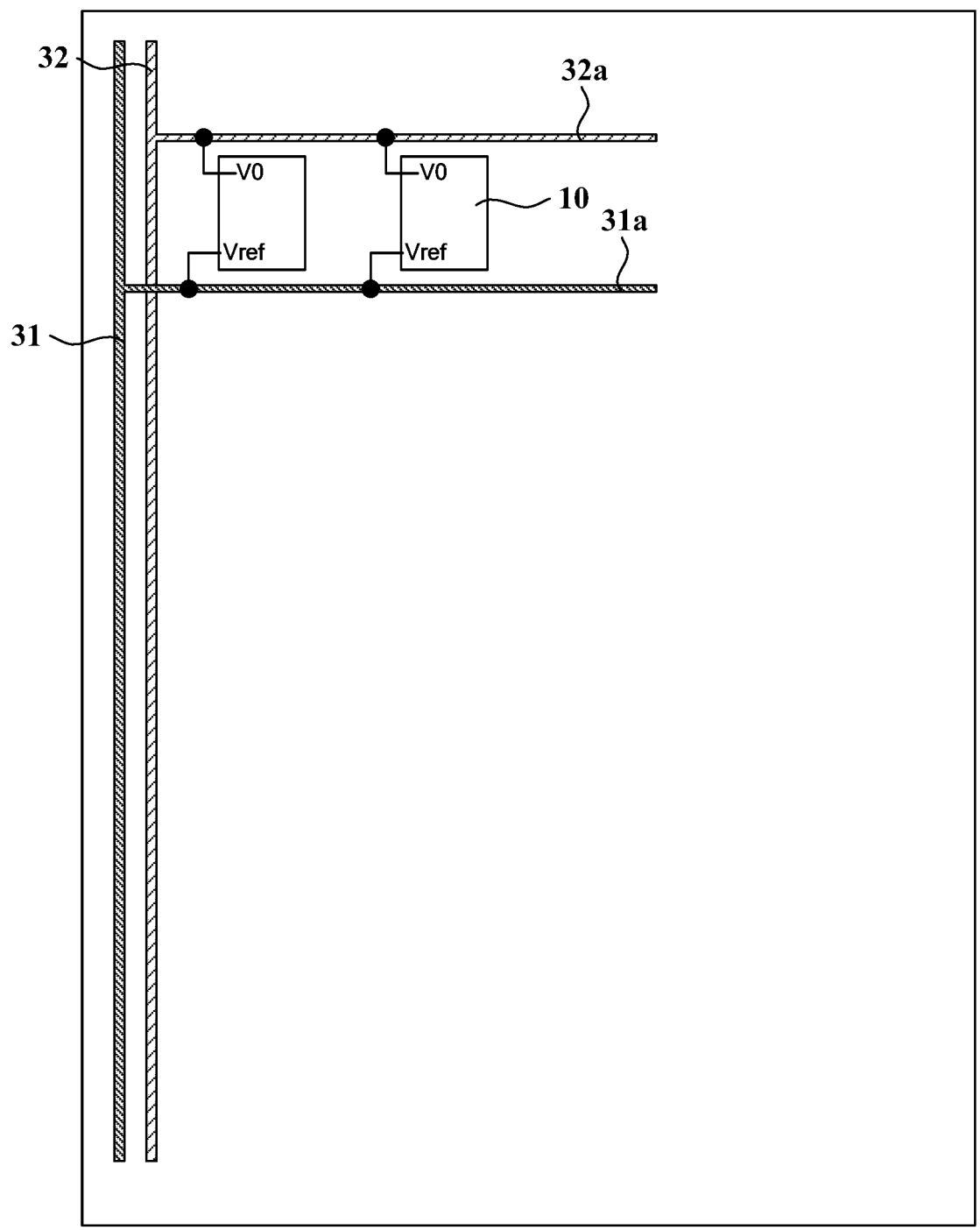
FIG. 23 is a schematic diagram of a display panel according to another embodiment of the present disclosure.

Referring to FIG. 23, FIG. 23 is a schematic diagram of a display panel according to another embodiment of the present disclosure. As shown in FIG. 23, in an embodiment, the bias adjustment signal bus 32 and at least one of the reset signal bus 31 and the initialization signal bus are located on a same side frame of the display panel; the bias adjustment signal bus 32 and at least one of the reset signal bus 31 and the initialization signal bus are arranged in different layers, the bias adjustment signal line 32a and the bias adjustment signal bus 32 are located on a same layer, and the reset signal line 31a and the reset signal bus 31 are located on a same layer, or the initialization signal line and the initialization signal bus are located on a same layer.

In this embodiment, the bias adjustment signal bus 32 and the reset signal bus 31 are located on a same side frame of the display panel. The bias adjustment signal line 32a and the bias adjustment signal bus 32 are located on a same layer and are made in a same metal layer. The bias adjustment signal line 32a is electrically connected to the bias adjustment signal terminal of each pixel circuit 10 in a corresponding row or through a via hole and the bias adjustment signal V0 is provided to the bias adjustment signal terminal of the each pixel circuit 10 in the corresponding row. The reset signal line 31a and the reset signal bus 31 are located on a same layer and are made in a same metal layer. The reset signal line 31a is electrically connected to the reset signal terminal of each pixel circuit 10 in a corresponding row or through a via hole and the reset signal Vref is provided to the reset signal terminal of the each pixel circuit 10 in the corresponding row. The bias adjustment signal bus 32 and the reset signal bus 31 are arranged in different layers, that is, the bias adjustment signal bus 32 and the reset signal bus 31 are located in different metal layers that are insulated from each other. In such arrangement, in a case where two types of signal lines are connected to their respective buses, no interference exists, and each electrical connection between a signal line and a respective bus is performed on a respective film layer, and no via hole needs to be provided and the process is optimized.

Figure 24:
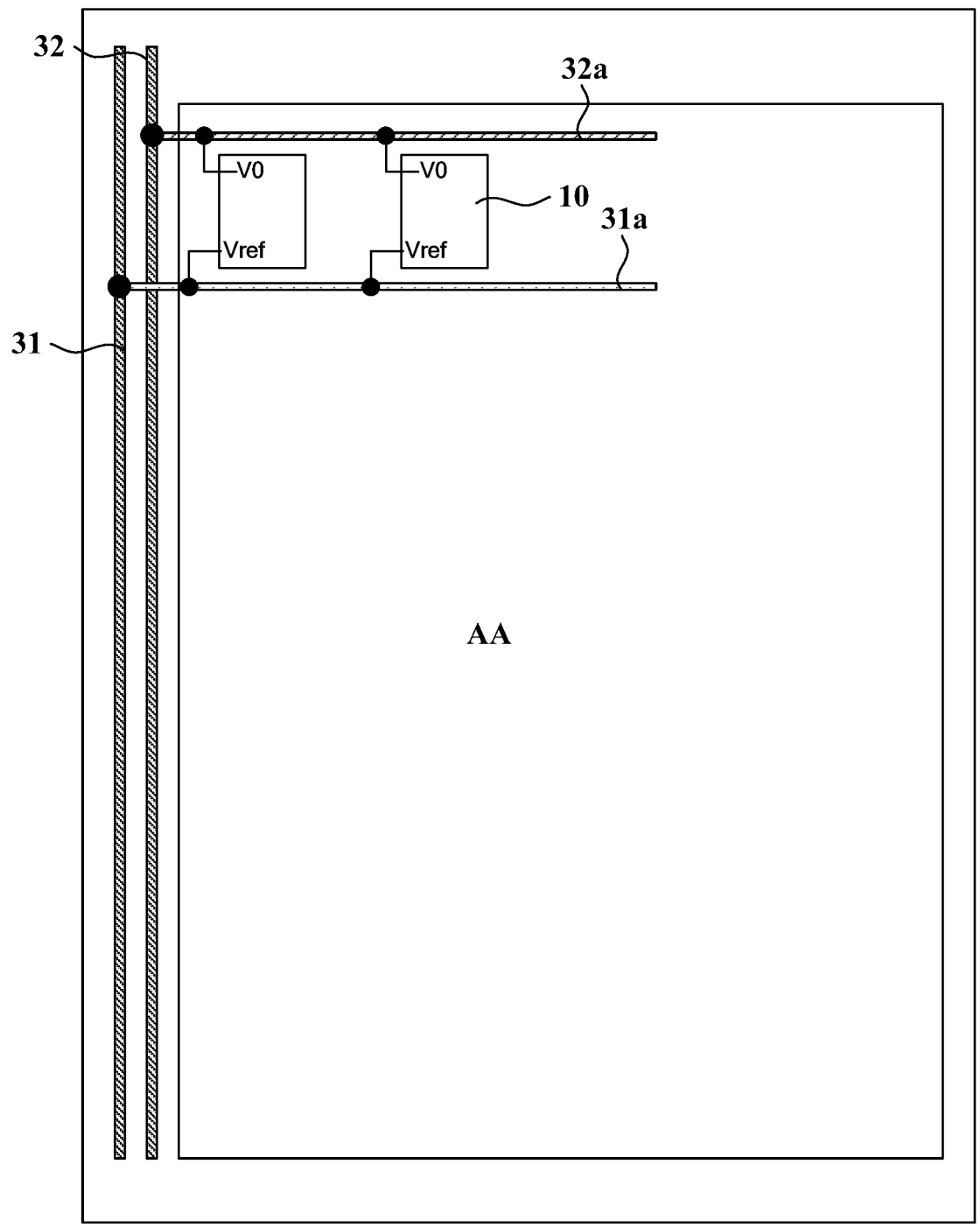
FIG. 24 is a schematic diagram of a display panel according to another embodiment of the present disclosure.

Referring to FIG. 24, FIG. 24 is a schematic diagram of a display panel according to another embodiment of the present disclosure. As shown in FIG. 24, in an embodiment, the bias adjustment signal bus 32 and at least one of the reset signal bus 31 and the initialization signal bus are located on a same side frame of the display panel; the bias adjustment signal bus 32 and at least one of the reset signal bus 31 and the initialization signal bus are arranged on a same layer, and the bias adjustment signal line 32a and at least one of the reset signal line 31a and the initialization signal line are located on different layers.

In this embodiment, the bias adjustment signal bus 32 and the reset signal bus 31 are located on the same side frame of the display panel. The reset signal bus 31 and the bias adjustment signal bus 32 are located on the same layer and are made in a same metal layer. The bias adjustment signal lines 32a are located on the same layer, are made in a same metal layer, are electrically connected to the bias adjustment signal bus 32, and are electrically connected to the bias adjustment signal terminals of the pixel circuits 10 in a corresponding row. The reset signal lines 31a are located on the same layer, are made in a same metal layer, are electrically connected to the reset signal bus 31, and are electrically connected to the reset signal terminals of the pixel circuits 10 in a corresponding row. It is to be understood that the bias adjustment signal line 32a and the reset signal line 31a are located in different layers, and the two are insulated. In such arrangement, since the signal buses are located on a same layer and two types of wirings are located on different layers, the two types of wirings extends outside the frame to be connected to a respective signal bus directly or through a via hole, in a relatively simple connection way.

In a case where normal wirings and normal connections among lines are ensured, in an embodiment, the display panel includes three metal layers and insulating layers therebetween. The three metal layers are a first metal layer where the bias adjustment signal bus 32 and the reset signal bus 31 are located, a second metal layer where the bias adjustment signal line 32a is located, and a third metal layer where the reset signal line 31a is located. The bias adjustment signal line 32a is electrically connected to the bias adjustment signal bus 32 through a via hole; the reset signal line 31a is electrically connected to the reset signal bus 31 through a via hole.

In other embodiments, the display panel may include two metal layers and an insulating layer therebetween. One of the two metal layers is a first metal layer where the bias adjustment signal bus, the reset signal bus, and the bias adjustment signal line are located; the other one of the two metal layers is a second metal layer where the reset signal line is located. The reset signal line is electrically connected to the reset signal bus through a via hole. Referring to FIG. 24, to ensure normal wirings and normal connections among lines, the bus closer to a display region AA is the bias adjustment signal bus 32 and is located on a same layer as the bias adjustment signal line 32a.

In other embodiments, the display panel may include two metal layers and an insulating layer therebetween. One of the two metal layers is a first metal layer where the bias adjustment signal bus, the reset signal bus, and the reset signal line are located; and the other one of the two metal layers is a second metal layer where the bias adjustment signal line is located. The bias adjustment signal line is electrically connected to the bias adjustment signal bus through a via hole. To ensure normal wirings and normal connections among lines, the bus closer to the display region is the reset signal bus, and is located on a same layer as the reset signal line.

Figure 25:
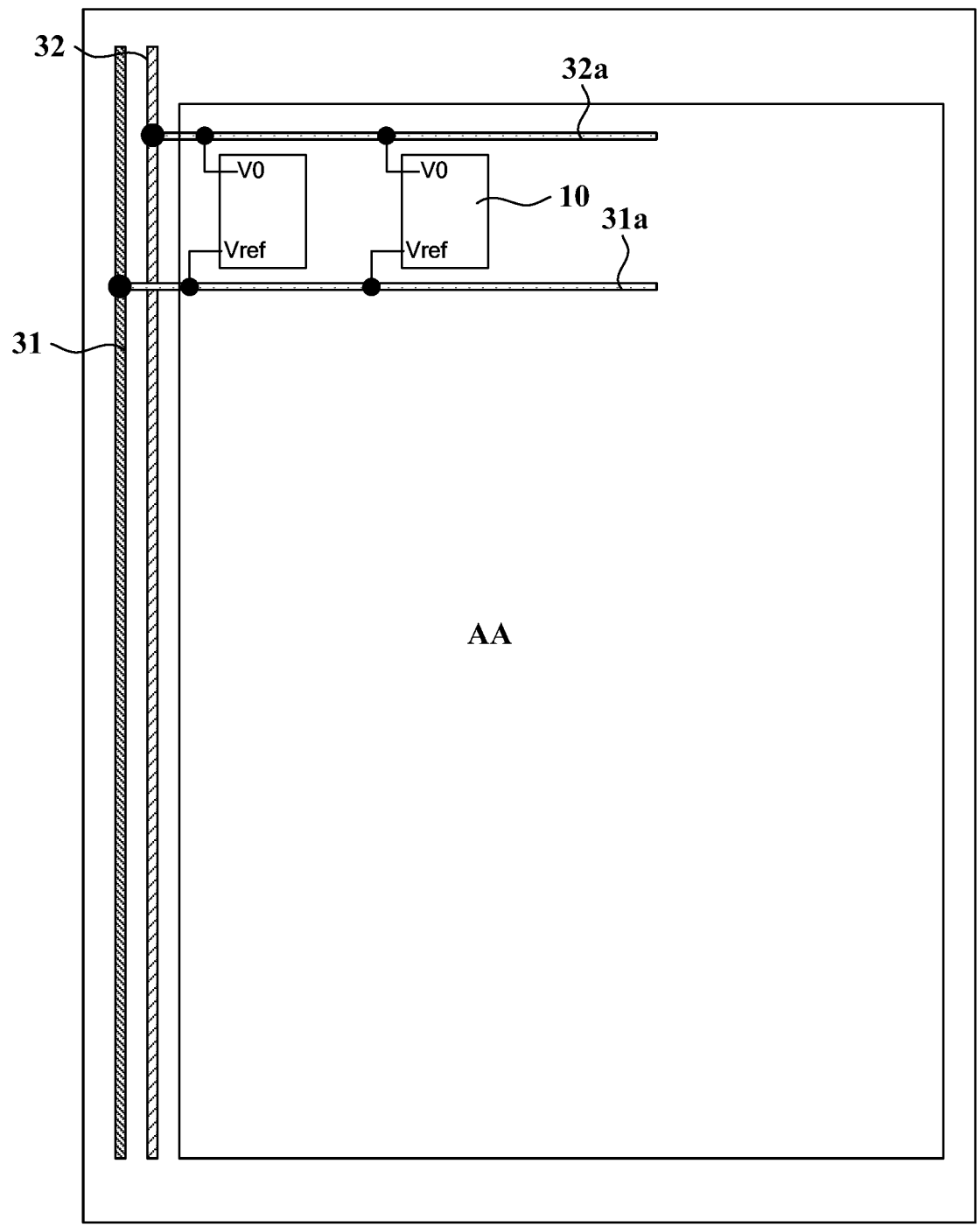
FIG. 25 is a schematic diagram of a display panel according to another embodiment of the present disclosure.

Referring to FIG. 25, FIG. 25 is a schematic diagram of a display panel according to another embodiment of the present disclosure. As shown in FIG. 25, in an embodiment, the bias adjustment signal bus 32 and at least one of the reset signal bus 31 and the initialization signal bus are located on a same side frame of the display panel; the bias adjustment signal bus 32 and at least one of the reset signal bus 31 and the initialization signal bus are arranged in different layers, the bias adjustment signal line 32a and at least one of the reset signal line 31a and the initialization signal line are located on a same layer, and one of the bias adjustment signal bus 32 and one of the reset signal bus 31 and the initialization signal bus, closer to the display region AA of the display panel, is electrically connected to a corresponding signal line through a via hole.

In this embodiment, the bias adjustment signal bus 32 and the reset signal bus 31 are located on the same side frame of the display panel. The reset signal bus 31 and the bias adjustment signal bus 32 are located in different metal layers. The bias adjustment signal line 32a and the reset signal line 31a are located on a same layer and are made in a same metal layer. In an embodiment, the bias adjustment signal bus 32 is one closer to the display region AA of the display panel, and the bias adjustment signal line 32a is electrically connected to the bias adjustment signal bus 32 through a via hole. In an embodiment, the reset signal line 31a is electrically connected to the reset signal bus 31 through a via hole. Or, in an embodiment, the reset signal line and the reset signal bus are located on a same layer. In such arrangement, one closer to the display region AA of the display panel needs to be electrically connected to a corresponding signal line through a via hole and another type of wiring is prevented from affecting the extension of the signal line on the film layer where the signal line is located.

Figure 26:
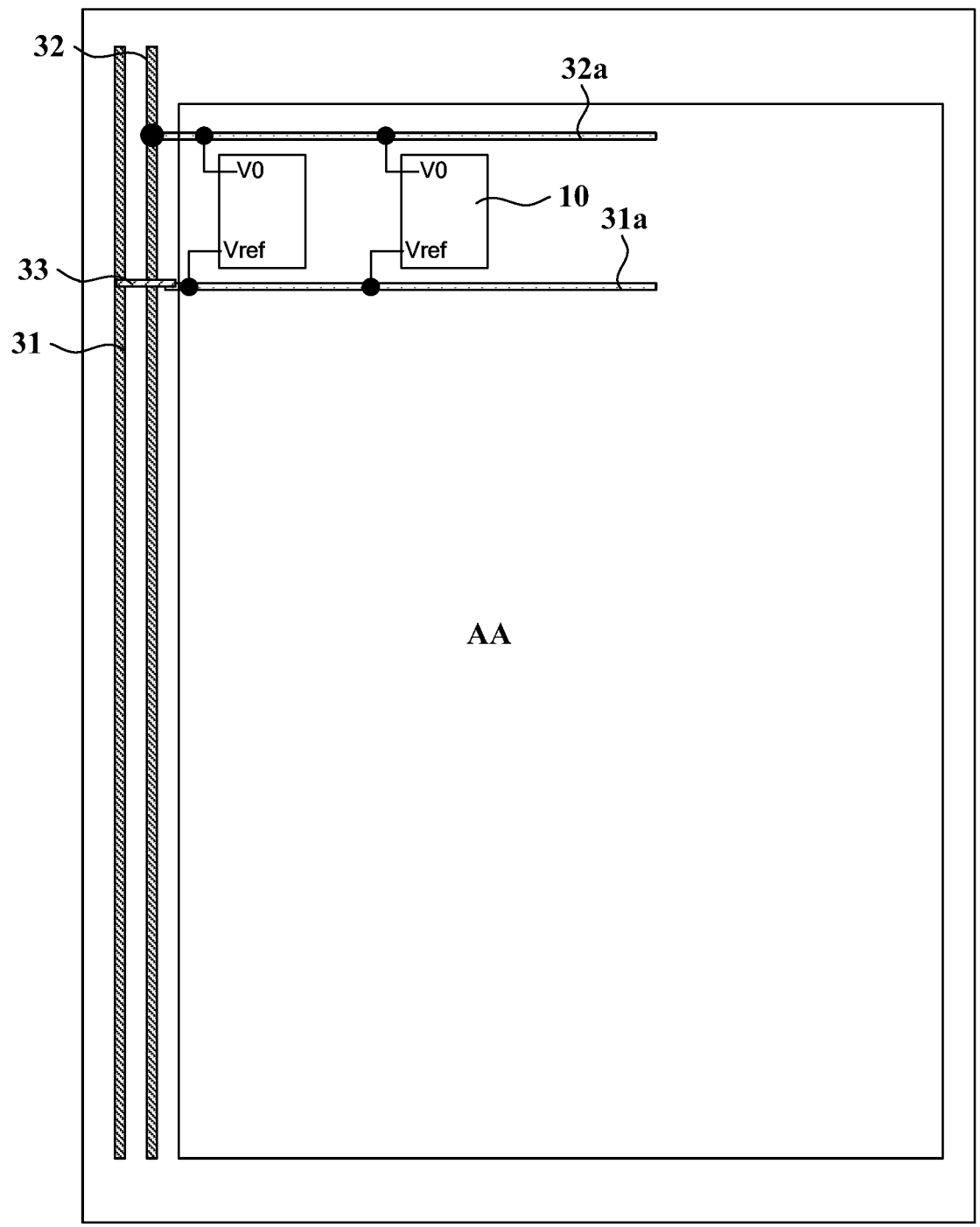
FIG. 26 is a schematic diagram of a display panel according to another embodiment of the present disclosure.

Referring to FIG. 26, FIG. 26 is a schematic diagram of a display panel according to another embodiment of the present disclosure. As shown in FIG. 26, in an embodiment, the bias adjustment signal bus 32 and at least one of the reset signal bus 31 and the initialization signal bus are located on a same side frame of the display panel; the bias adjustment signal bus 32 and at least one of the reset signal bus 31 and the initialization signal bus are arranged on a same layer, the bias adjustment signal line 32a and at least one of the reset signal line 31a and the initialization signal line are located on a same layer, and one of the bias adjustment signal bus 32 and one of the reset signal bus 31 and the initialization signal bus, farther from the display region AA of the display panel, is electrically connected to a corresponding signal line through a bridge 33. The bridge 33 is located in a different layer from the one farther from the display region AA of the display panel.

In this embodiment, the bias adjustment signal bus 32 and the reset signal bus 31 are located on the same side frame of the display panel. The reset signal bus 31 and the bias adjustment signal bus 32 are located in a same metal layer. The bias adjustment signal line 32a and the reset signal line 31a are located on the same layer and are made in a same metal layer. In an embodiment, the bias adjustment signal bus 32 is one closer to the display region AA of the display panel, and the bias adjustment signal line 32a is electrically connected to the bias adjustment signal bus 32 through a via hole. In an embodiment, the reset signal bus 31 is one farther from the display region AA of the display panel, and the reset signal line 31a is electrically connected to the reset signal bus 31 through the bridge 33. In such arrangement, in a case where the preceding signal buses and signal lines are located on the same film layer, a signal bus farther from the display region is connected to a corresponding signal line, and the bridge is needed for the connection and the normal extension is ensured.

It is to be understood that the stacking relationships of the reset signal line, the reset signal bus, the bias adjustment signal line, and the bias adjustment signal bus provided above are just a variety of examples. In a case where the normal connection of the lines is not affected, the stacking relationship of the reset signal line, the reset signal bus, the bias adjustment signal line, and the bias adjustment signal bus may also include various other examples, which are not limited herein.

Figure 27:
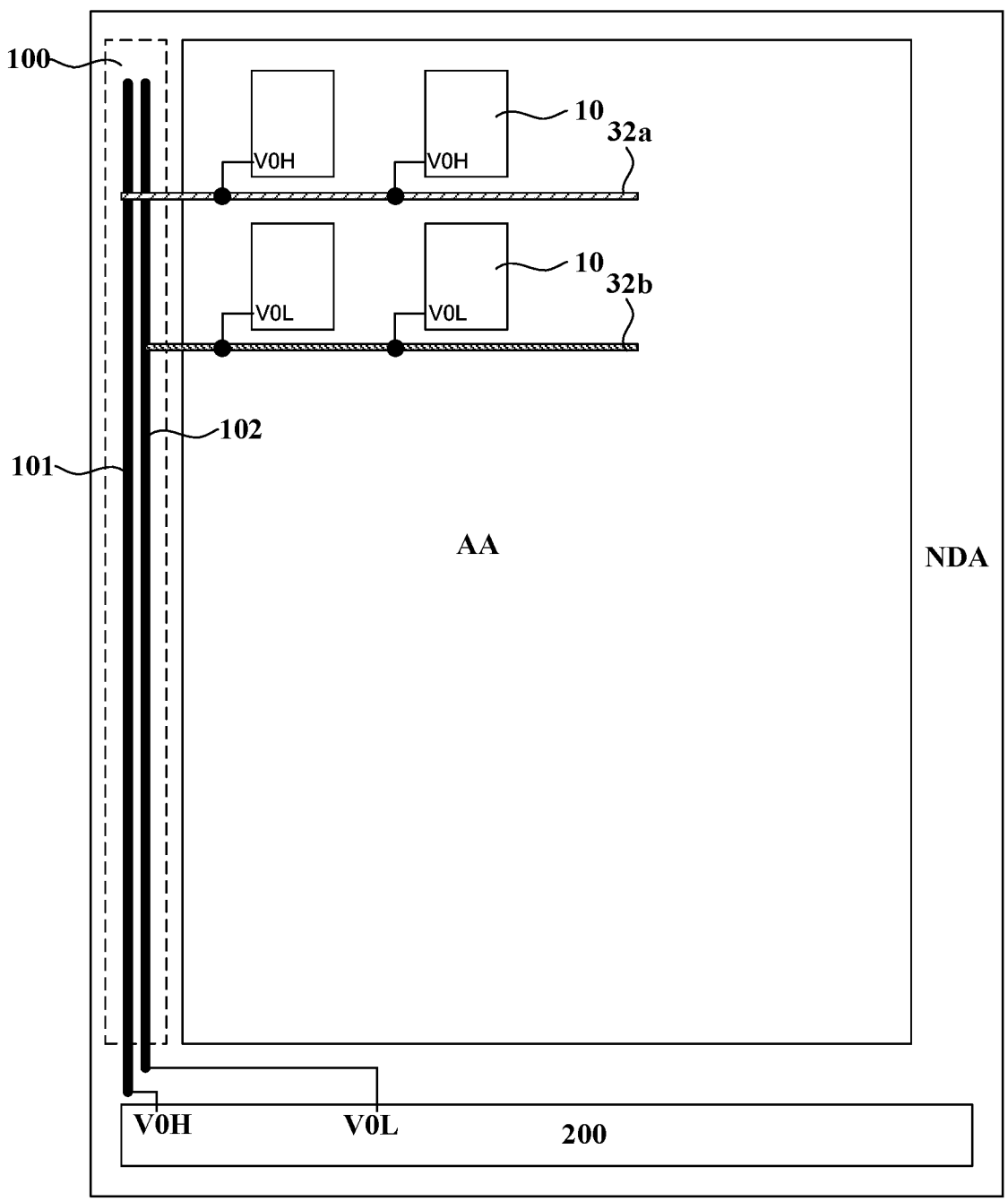
FIG. 27 is a schematic diagram of a display panel according to another embodiment of the present disclosure.

By way of example, referring to FIG. 27, FIG. 27 is a schematic diagram of a display panel according to another embodiment of the present disclosure. As shown in FIG. 27, in an embodiment, the display panel includes the bias adjustment signal line, and the bias adjustment signal terminal is connected to the bias adjustment signal line. In an embodiment, the display panel further includes a drive circuit 100 and an integrated chip 200. The drive circuit 100 provides a drive signal to the pixel circuit 10, and the integrated chip 200 provides a first drive signal and a second drive signal to the drive circuit 100. The first drive signal is a high-level signal V0H, and the second drive signal is a low-level signal V0L. The drive transistor is a PMOS transistor, and the bias adjustment signal is V0H same as the first drive signal, or the drive transistor is an NMOS transistor, and the bias adjustment signal is V0L same as the second drive signal. In such arrangement, an existing signal in the panel may also serve as the bias adjustment signal and the design process of the panel can be simplified, and the wiring space of the panel can be saved.

In this embodiment, the display panel includes the integrated chip 200, and the integrated chip 200 is configured to provide the drive signal required to the pixel circuit such as the data signal Vdata, the reset signal Vref, and the bias adjustment signal V0. The display panel further includes the drive circuit 100, and the integrated chip 200 and the drive circuit 100 are both disposed in a non-display region NDA of the display panel. The drive circuit 100 provides the drive signal to the pixel circuit 10 in the display region AA. In an embodiment, the drive signal includes one or more of a scan signal, a bias adjustment signal, a reset signal, an initialization signal, a data write signal, a power supply voltage signal, or a light-emitting control signal.

In an embodiment, at least one side frame of the display panel is provided with the first drive signal line 101 and the second drive signal line 102. In a case where the drive transistor is a PMOS transistor, the bias adjustment signal line 32a is connected to the first drive signal line 101; or in a case where the drive transistor is an NMOS transistor, the bias adjustment signal line 32b is connected to the second drive signal line 102. In this embodiment, the first drive signal line 101 and the second drive signal line 102 are located on the same side frame of the display panel. In other embodiments, the first drive signal line and the second drive signal line are located on different side frames of the display panel. In such arrangement, an area of the side frame can be further saved by reusing signal wirings.

It is to be noted that all the drive transistors of the pixel circuits 10 in the display panel may be same PMOS transistors or same NMOS transistors. As shown in FIG. 27, the types of drive transistors of two adjacent rows of pixel circuits 10 are different, which is just for example, in order to illustrate connection manners between different drive signal lines and bias adjustment signal lines. The circuit structure of the display panel is not limited thereto.

By way of example, for the display panel described in any one of the preceding embodiments, in an embodiment, in the light emission stage of the light-emitting element, the source voltage of the drive transistor is Vs1, the voltage of the drain of the drive transistor is Vd1, and the voltage of the gate of the drive transistor is Vg1; in the bias adjustment stage, the source voltage of the drive transistor is Vs2, the voltage of the drain of the drive transistor is Vd2, the voltage of the gate of the drive transistor is Vg2, and the bias adjustment signal is V0. In a case where the drive transistor is a PMOS transistor, (V0−Vg2)≥(Vg1−Vd1) is satisfied; or in a case where the drive transistor is an NMOS transistor, (Vg2−V0)≥(Vd1−Vg1) is satisfied.

The working process of the pixel circuit includes a pre-stage and a light emission stage, and the pre-stage includes the bias adjustment stage.

In a case where the drive transistor is a PMOS transistor, in the bias adjustment stage, the voltage of the gate of the drive transistor is Vg2, and the voltage of the drain of the drive transistor is V0 same as the bias adjustment signal, satisfying V0=V0H, and the drive transistor is reversely biased in this stage, accordingly, the voltage Vg2 of the gate of the drive transistor is lower than the voltage V0 of the drain of the drive transistor, that is, Vg2 is less than V0, and it can be known that V0−Vg2 is greater than zero. In the light emission stage, the voltage of the gate of the drive transistor is Vg1, the voltage of the drain of the drive transistor is Vd1, and the drive transistor is in a non-reverse biased state in this stage, accordingly, the voltage Vg1 of the gate of the drive transistor is higher than the voltage Vd1 of the drain of the drive transistor, that is, Vg1>Vd1, and it can be known that Vg1−Vd1>0. Since the non-bias stage such as the light emission stage of the display panel have a relatively long time, to fully balance the threshold voltage drift in the non-bias stage in the bias adjustment stage and avoid a long time of the bias adjustment stage, it may be set: (V0−Vg2)≥(Vg1−Vd1). In such arrangement, V0−Vg2 in the bias adjustment stage is great enough and in the bias adjustment stage, the expected bias effect is achieved as soon as possible, and the phenomenon of threshold voltage drift caused by the potential difference between the potential of the gate of the drive transistor and the potential of the drain of the drive transistor in the light emission stage is ameliorated.

In a case where the drive transistor is an NMOS transistor, in the bias adjustment stage, the voltage of the gate of the drive transistor is Vg2, and the voltage of the drain of the drive transistor is V0 same as the bias adjustment signal, satisfying V0=V0L, and moreover, the drive transistor is reversely biased in this stage, accordingly, the voltage Vg2 of the gate of the drive transistor is higher than the voltage V0 of the drain of the drive transistor, that is, Vg2 is greater than V0, and it can be known that Vg2−V0 is greater than zero. In the light emission stage, the voltage of the gate of the drive transistor is Vg1, the voltage of the drain of the drive transistor is Vd1, and the drive transistor is in a non-reverse biased state in this stage, accordingly, the voltage Vg1 of the gate of the drive transistor is lower than the voltage Vd1 of the drain of the drive transistor, and it can be known that Vd1−Vg1>0. Since the non-bias stage such as the light emission stage of the display panel have a relatively long time, to fully balance the threshold voltage drift in the non-bias stage in the bias adjustment stage and avoid a long time of the bias adjustment stage, it may be set: (Vg2−V0)≥(Vd1−Vg1). In such arrangement, Vg2−V0 in the bias adjustment stage is great enough and in the bias adjustment stage, the expected bias effect is achieved as soon as possible, and the phenomenon of threshold voltage drift caused by the potential difference between the potential of the gate of the drive transistor and the potential of the drain of the drive transistor in the light emission stage is ameliorated.

By way of example, for the display panel of any one of the preceding embodiments, in an embodiment, the pixel circuit 10 includes the first light-emitting control device 17, and the light-emitting control device 17 is connected between the first power supply voltage signal terminal PVDD and the drive device 12, where the first power supply voltage signal terminal PVDD provides the high-level signal Vdd. In a case where the bias adjustment signal is V0, the high-level signal provided by the first power supply voltage signal terminal PVDD is Vdd, and the drive transistor is a PMOS transistor, V0>Vdd is satisfied. In an embodiment, V0≥Vdd×1.2 is satisfied.

In a case where the drive transistor is a PMOS transistor, V0 is a high-level signal. To fully balance the threshold voltage drift in the light emission stage in the bias adjustment stage, V0 may be set to be great enough, and then the potential difference between the voltage V0 of the drain of the drive transistor and the voltage of the gate of the drive transistor in the bias adjustment stage is great enough and in the bias adjustment stage, the expected bias effect is achieved as soon as possible, and the phenomenon of threshold voltage drift caused by the potential difference between the potential of the gate of the drive transistor and the potential of the drain of the drive transistor in the light emission stage is ameliorated.

In a case where the bias adjustment effect on the voltage of the first power supply voltage signal Vdd is insufficient, to make the bias adjustment effect more apparent, V0 may be a voltage higher than the Vdd signal. For example, the Vdd signal is usually 4.6 V, then V0 is usually greater than or equal to (Vdd×1.2), that is, greater than or equal to 5.5 V. Generally, the range of V0 is from 6 V to 10 V, and the voltage between the gate and the drain can be fully adjusted.

By way of example, for the display panel described in any one of the preceding embodiments, in an embodiment, the pixel circuit 10 includes the initialization device 16. In an embodiment, the initialization signal is a low-level signal, the bias adjustment signal is V0, the initialization signal is Vini, and in a case where the drive transistor T2 is an NMOS transistor, V0<Vini is satisfied. In an embodiment, V0≤Vini×1.2 is satisfied.

In a case where the drive transistor is an NMOS transistor, V0 is a low-level signal. To fully balance the threshold voltage drift in the light emission stage in the bias adjustment stage, V0 may be set to be small enough, and then the potential difference between the voltage of the gate and the voltage V0 of the drain of the drive transistor in the bias adjustment stage is great enough and in the bias adjustment stage, the expected bias effect is achieved as soon as possible, and the phenomenon of threshold voltage drift caused by the potential difference between the potential of the gate of the drive transistor and the potential of the drain of the drive transistor in the light emission stage is ameliorated.

In a case where the bias adjustment effect on the initialization signal Vini is insufficient, to make the bias adjustment effect more apparent, V0 may be a voltage lower than Vini. For example, currently, Vini is usually −3.6V, accordingly, V0 is usually lower than or equal to (Vini×1.2), that is, lower than or equal to −4.3V. Generally, the range of V0 is from −10V to −5V, and the voltage between the gate and the drain can be fully adjusted.

Figure 28:
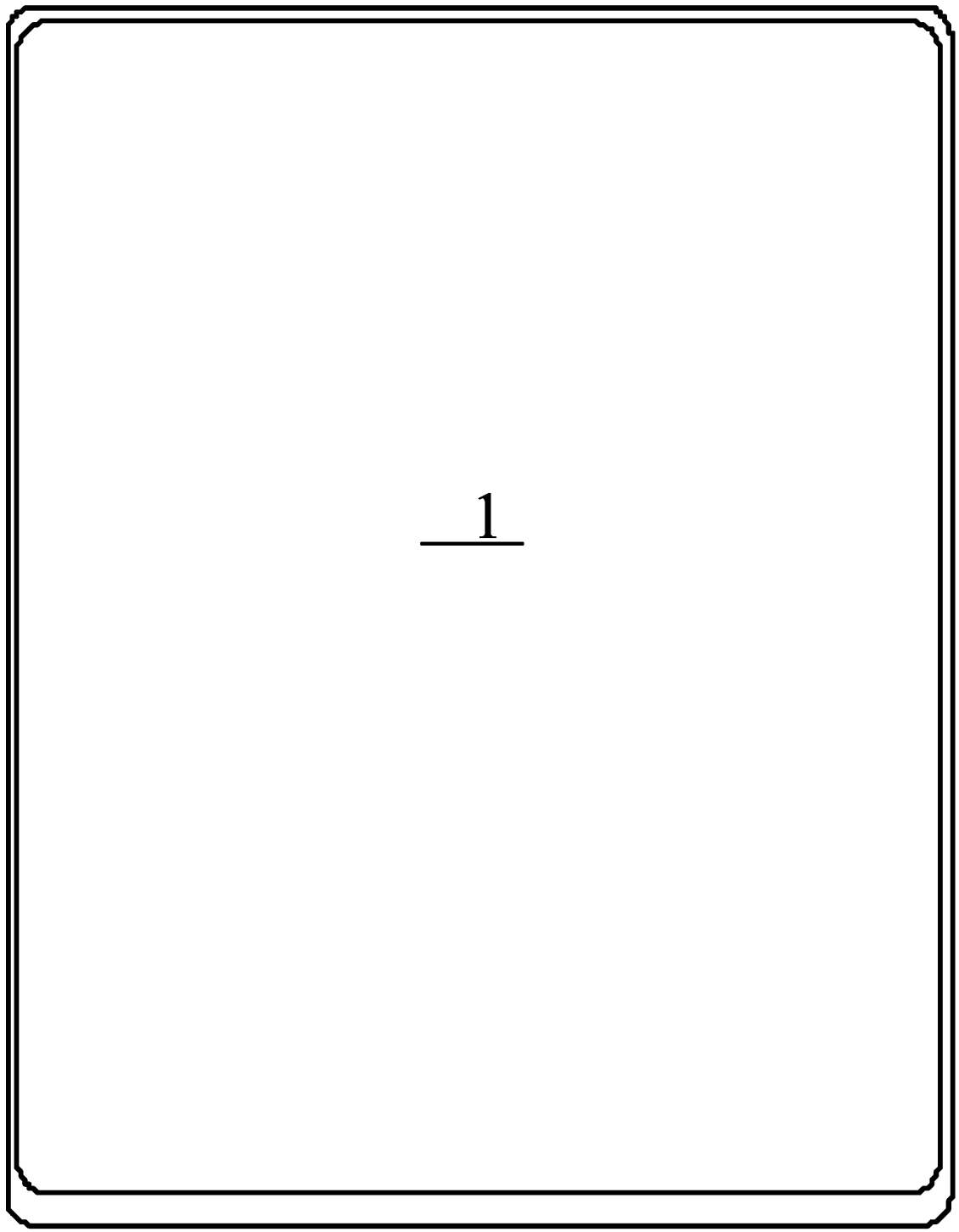
FIG. 28 is a schematic diagram of a display device according to an embodiment of the present disclosure.

Embodiments of the present disclosure further provide a display device. The display device includes the preceding display panel. In an embodiment, the display panel is an organic light-emitting display panel or a micro LED display panel. Referring to FIG. 28, FIG. 28 is a schematic diagram of a display device according to an embodiment of the present disclosure. As shown in FIG. 28, in an embodiment, the display device is applied to an electronic device 1 such as a smart phone and a tablet computer. It is to be understood that the preceding embodiments merely provide some examples of the pixel circuit structures, and the display panel further includes other structures, which will not be repeated herein.

In this embodiment, by setting the bias adjustment device, the bias adjustment signal provided to the drain of the drive transistor is adjusted.

The display panel includes non-bias stages such as the light emission stage. In this stage, in a case where the PMOS drive transistor is turned on, a situation where the potential of the gate of the drive transistor is higher than the potential of the drain of the drive transistor may exists, and the voltage difference between the gate and the drain may be relatively great. In such a case, the Id-Vg curve of the drive transistor is caused to drift, which further cause the threshold voltage Vth of the drive transistor to drift. To ameliorate this phenomenon, the bias adjustment stage is set, and the potential of the gate of the drive transistor is lower than the potential of the drain of the drive transistor, and in such arrangement, the potential difference between the potential of the gate of the drive transistor and the potential of the drain of the drive transistor is adjusted, the Id-Vg curve drift is ameliorated, and thus the phenomenon of threshold voltage Vth drift of the drive transistor is ameliorated.

The display panel includes non-bias stages such as the light emission stage. In this stage, in a case where the NMOS drive transistor is turned on, a situation where the potential of the gate of the drive transistor is lower than the potential of the drain of the drive transistor may exist, and the voltage difference between the gate and the drain may be relatively great. In such case, the Id-Vg curve of the drive transistor is caused to drift, which further cause the threshold voltage Vth of the drive transistor to drift. To ameliorate this phenomenon, the bias adjustment stage is set, and the potential of the gate of the drive transistor is higher than the potential of the drain of the drive transistor, and in such arrangement, the potential difference between the potential of the gate of the drive transistor and the potential of the drain of the drive transistor is adjusted, the Id-Vg curve drift is ameliorated, and thus the phenomenon of threshold voltage Vth drift of the drive transistor is ameliorated.

What is claimed is:

1. A display panel, comprising:
a pixel circuit and a light-emitting element;
wherein the pixel circuit comprises a data write device, a drive device and a bias adjustment device;
the pixel circuit further comprises at least one of a reset device or an initialization device;
wherein the display panel further comprises:
a bias adjustment signal line, the bias adjustment signal line is connected to the bias adjustment device and configured to provide a bias adjustment signal;
at least one of a reset signal line or an initialization signal line, the reset signal line is connected to the reset device and configured to provide a reset signal, or the initialization signal line is connected to the initialization device and configured to provide an initialization signal;
wherein, at least one side frame of the display panel comprises:
a bias adjustment signal bus, the bias adjustment signal line is connected to the bias adjustment signal bus;
at least one of a reset signal bus or an initialization signal bus, the reset signal line is connected to the reset signal bus, or the initialization signal line is connected to the initialization signal bus; and,
wherein, the bias adjustment signal bus is disposed in a first side frame of the display panel, the reset signal bus or the initialization signal bus is disposed in a second side frame of the display panel, and the first side frame is adjacent to the second side frame, or is opposite to the second side frame; or,
the bias adjustment signal bus is disposed in a same side frame with the reset signal bus or the initialization signal bus.

2. The display panel according to claim 1, wherein
the bias adjustment signal bus and the reset signal bus are disposed in different layers; and
the bias adjustment signal line and the bias adjustment signal bus are disposed in a same layer, and the reset signal line and the reset signal bus are disposed in a same layer;
or, wherein
the bias adjustment signal bus and the initialization signal bus are disposed in different layers; and
the bias adjustment signal line and the bias adjustment signal bus are disposed in a same layer, and the initialization signal line and the initialization signal bus are disposed in a same layer.

3. The display panel according to claim 1, wherein
the bias adjustment signal bus and the reset signal bus are disposed in different layers; and
the bias adjustment signal line and the reset signal line are disposed in a same layer;
or, wherein
the bias adjustment signal bus and the initialization signal bus are disposed in different layers; and
the bias adjustment signal line and the initialization signal line are disposed in a same layer.

4. The display panel according to claim 3, wherein
one of the bias adjustment signal bus and the reset signal bus closer to the display region of the display panel is electrically connected to a corresponding signal line through a via hole;
or,
one of the bias adjustment signal bus and the initialization signal bus closer to the display region of the display panel is electrically connected to a corresponding signal line through a via hole.

5. The display panel according to claim 1, wherein
the bias adjustment signal bus and the reset signal bus are disposed in a same layer; and
the bias adjustment signal line and the reset signal line are disposed in a same layer;
or, wherein
the bias adjustment signal bus and the initialization signal bus are disposed in a same layer; and
the bias adjustment signal line and the initialization signal line are disposed in a same layer.

6. The display panel according to claim 1, wherein
the display panel comprises a side frame of long sides and a side frame of short sides; and
wherein, each of the first side frame and the second side frame is the side frame of long sides of the display panel, and the first side frame is opposite to the second side frame.

7. The display panel according to claim 1, wherein
the pixel circuit comprises a first light-emitting control device, the first light-emitting control device is connected between a first power supply voltage signal line and the drive device, the first power supply voltage signal line is used to transmit a first power supply voltage signal, and wherein, a width of the bias adjustment signal line is lower than a width of the first power supply voltage signal line.

8. The display panel according to claim 7, wherein
the bias adjustment signal line and the first power supply voltage signal line extend in a same direction.

9. The display panel according to claim 7, wherein
the bias adjustment signal line and the first power supply voltage signal line are disposed in a same layer; or,
the bias adjustment signal line and the first power supply voltage signal line are disposed in different layers.

10. The display panel according to claim 1, wherein
the bias adjustment signal line and the reset signal line extend in a same direction; or,
the bias adjustment signal line and the initialization signal line extend in a same direction.

11. The display panel according to claim 1, wherein
the display panel comprises a side frame of long sides and a side frame of short sides; and
an extension direction of the bias adjustment signal line is parallel to an extension direction of the side frame of short sides of the display panel.

12. The display panel according to claim 1, wherein
the bias adjustment signal bus is disposed in two or more side frames of the display panel.

13. The display panel according to claim 1, wherein
the drive device comprises a drive transistor;
the data write device is connected to a source of the drive transistor;
the bias adjustment device is connected between the source of the drive transistor and the bias adjustment signal line or between a drain of the drive transistor and the bias adjustment signal line.

14. The display panel according to claim 1, wherein
the pixel circuit further comprises a compensation device, the compensation device is connected between a gate of a drive transistor and a drain of the drive transistor; and
a working process of the pixel circuit comprises a bias adjustment stage, and in the bias adjustment stage, the bias adjustment device is turned on and the compensation device is turned off.

15. The display panel according to claim 1, wherein
a working process of the pixel circuit comprises a reset stage;
an end of the reset device is connected to the reset signal line and configured to receive the reset signal, and another end of the reset device is connected to a gate of a drive transistor; and
in the reset stage, the reset device is turned on to provide the reset signal to the gate of the drive transistor.

16. The display panel according to claim 15, wherein
the working process of the pixel circuit further comprises a bias adjustment stage, and in the bias adjustment stage, the bias adjustment device is turned on; and
the reset stage at least partially overlap the bias adjustment stage in time.

17. The display panel according to claim 1, wherein
a working process of the pixel circuit comprises an initialization stage; and
in the initialization stage, the initialization device is turned on to provide the initialization signal for the light-emitting element.

18. The display panel according to claim 17, wherein
a control terminal of the initialization device and a control terminal of the bias adjustment device are connected to a same scan signal line, and in the initialization stage, the scan signal line is used to control the initialization device and the bias adjustment device to be turned on at a same time.

19. The display panel according to claim 17, wherein
a control terminal of the initialization device, a control terminal of the bias adjustment device, and a control terminal of the reset device are all connected to a same scan signal line, and in the initialization stage, the scan signal line is used to control the initialization device, the bias adjustment device, and the reset device to be turned on at a same time.

20. A display device, comprising a display panel, wherein the display panel, comprises:
a pixel circuit and a light-emitting element;
wherein the pixel circuit comprises a data write device, a drive device and a bias adjustment device; the pixel circuit further comprises at least one of a reset device or an initialization device;
wherein the display panel further comprises:
a bias adjustment signal line, the bias adjustment signal line is connected to the bias adjustment device and configured to provide a bias adjustment signal;
at least one of a reset signal line or an initialization signal line, the reset signal line is connected to the reset device and configured to provide a reset signal, or the initialization signal line is connected to the initialization device and configured to provide an initialization signal;
wherein, at least one side frame of the display panel comprises:
a bias adjustment signal bus, the bias adjustment signal line is connected to the bias adjustment signal bus;
at least one of a reset signal bus or an initialization signal bus, the reset signal line is connected to the reset signal bus, or the initialization signal line is connected to the initialization signal bus; and,
wherein, the bias adjustment signal bus is disposed in a first side frame of the display panel, the reset signal bus or the initialization signal bus is disposed in a second side frame of the display panel, and the first side frame is adjacent to the second side frame, or is opposite to the second side frame; or, the bias adjustment signal bus is disposed in a same side frame with the reset signal bus or the initialization signal bus.

* * * * *